(12) United States Patent
Kanaya

(10) Patent No.: US 8,098,362 B2
(45) Date of Patent: Jan. 17, 2012

(54) DETECTION DEVICE, MOVABLE BODY APPARATUS, PATTERN FORMATION APPARATUS AND PATTERN FORMATION METHOD, EXPOSURE APPARATUS AND EXPOSURE METHOD, AND DEVICE MANUFACTURING METHOD

(75) Inventor: Yuho Kanaya, Kumagaya (JP)

(73) Assignee: Nikon Corporation, Tokyo (JP)

( * ) Notice: Subject to any disclaimer, the term of this patent is extended or adjusted under 35 U.S.C. 154(b) by 739 days.

(21) Appl. No.: 12/128,036

(22) Filed: May 28, 2008

(65) Prior Publication Data

US 2009/0004580 A1 Jan. 1, 2009

Related U.S. Application Data

(60) Provisional application No. 60/924,736, filed on May 30, 2007.

(51) Int. Cl.
*G03B 27/42* (2006.01)

(52) U.S. Cl. ............................................. 355/53; 355/72
(58) Field of Classification Search .................... 355/30, 355/53, 72
See application file for complete search history.

(56) References Cited

U.S. PATENT DOCUMENTS

| | | | |
|---|---|---|---|
| 4,465,368 A | 8/1984 | Matsuura et al. | |
| 4,780,617 A | 10/1988 | Umatate et al. | |
| 5,448,332 A | 9/1995 | Sakakibara et al. | |
| 5,610,715 A * | 3/1997 | Yoshii et al. | 356/499 |
| 5,969,441 A | 10/1999 | Loopstra et al. | |
| 6,208,407 B1 | 3/2001 | Loopstra | |
| 6,590,634 B1 | 7/2003 | Nishi et al. | |
| 6,611,316 B2 | 8/2003 | Sewell | |
| 6,639,686 B1 | 10/2003 | Ohara | |
| 6,778,257 B2 | 8/2004 | Bleeker et al. | |
| 6,952,253 B2 | 10/2005 | Lof et al. | |
| 7,023,610 B2 | 4/2006 | Ohtsuki et al. | |
| 2002/0041377 A1 | 4/2002 | Hagiwara et al. | |
| 2002/0061469 A1 | 5/2002 | Tanaka | |
| 2003/0025890 A1 | 2/2003 | Nishinaga | |
| 2005/0168714 A1 | 8/2005 | Renkens et al. | |
| 2005/0206887 A1 * | 9/2005 | Morioka et al. | 356/237.5 |
| 2005/0248856 A1 | 11/2005 | Omura et al. | |
| 2005/0280791 A1 | 12/2005 | Nagasaka et al. | |
| 2006/0007419 A1 | 1/2006 | Streefkerk et al. | |

(Continued)

FOREIGN PATENT DOCUMENTS

EP 1 079 223 A1 2/2001

(Continued)

OTHER PUBLICATIONS

English translation of WO 03-065428.

(Continued)

*Primary Examiner* — Edward Glick
*Assistant Examiner* — Mesfin T Asfaw
(74) *Attorney, Agent, or Firm* — Oliff & Berridge, PLC

(57) ABSTRACT

By irradiating a detection beam from an irradiation system of a detection device to a scale used for measuring the position of a wafer stage, and detecting the detection beam via the scale by a photodetection system, a surface state (an existence state of foreign substance) of the scale is detected. With this operation, detection of the surface state can be performed contactlessly with respect to the scale. Moreover, movement control of the wafer stage can be performed with high precision by taking the surface state into consideration.

20 Claims, 21 Drawing Sheets

U.S. PATENT DOCUMENTS

| | | |
|---|---|---|
| 2006/0227309 A1 | 10/2006 | Loopstra et al. |
| 2006/0231206 A1 | 10/2006 | Nagasaka et al. |
| 2007/0052976 A1 | 3/2007 | Pril et al. |
| 2007/0263191 A1 | 11/2007 | Shibazaki |
| 2007/0263197 A1 | 11/2007 | Luttikhuis et al. |
| 2007/0285631 A1* | 12/2007 | Stavenga et al. ............ 355/30 |
| 2007/0288121 A1 | 12/2007 | Shibazaki |
| 2008/0008843 A1 | 1/2008 | Ratel |
| 2008/0043212 A1 | 2/2008 | Shibazaki |
| 2008/0088843 A1 | 4/2008 | Shibazaki |

FOREIGN PATENT DOCUMENTS

| | | |
|---|---|---|
| EP | 1 420 298 A2 | 5/2004 |
| EP | 1 630 585 A1 | 3/2006 |
| EP | 1 783 822 A1 | 5/2007 |
| JP | A-57-117238 | 7/1982 |
| JP | A-61-044429 | 3/1986 |
| JP | A-06-283403 | 10/1994 |
| JP | A-10-163099 | 6/1998 |
| JP | A-10-214783 | 8/1998 |
| JP | A-11-016816 | 1/1999 |
| JP | A-2000-505958 | 5/2000 |
| JP | A-2001-313250 | 11/2001 |
| JP | A-2002-014005 | 1/2002 |
| JP | A-2003-028673 | 1/2003 |
| JP | A-2004-519850 | 7/2004 |
| JP | A-2004-289126 | 10/2004 |
| JP | A-2005-114406 | 4/2005 |
| WO | WO 99/46835 A1 | 9/1999 |
| WO | WO 99/60361 A1 | 11/1999 |
| WO | WO 01/35168 A1 | 5/2001 |
| WO | WO 03/065428 A1 | 8/2003 |
| WO | WO 2004/019128 A2 | 3/2004 |
| WO | WO 2004/055801 A1 | 7/2004 |
| WO | WO 2004/057590 A1 | 7/2004 |
| WO | WO 2004/086468 A1 | 10/2004 |
| WO | WO 2004/107011 A1 | 12/2004 |
| WO | WO 2005/029559 A1 | 3/2005 |
| WO | WO 2006/038952 A2 | 4/2006 |
| WO | WO 2007/097379 A1 | 8/2007 |

OTHER PUBLICATIONS

Written Opinion issued in Application No. PCT/JP2008/060323 on Nov. 30, 2009.

* cited by examiner

DETECTION DEVICE, MOVABLE BODY APPARATUS, PATTERN FORMATION APPARATUS AND PATTERN FORMATION METHOD, EXPOSURE APPARATUS AND EXPOSURE METHOD, AND DEVICE MANUFACTURING METHOD

CROSS-REFERENCE TO RELATED APPLICATIONS

This non-provisional application claims the benefit of Provisional Application No. 60/924,736 filed May 30, 2007, the disclosure of which is hereby incorporated herein by reference in its entirety.

BACKGROUND OF THE INVENTION

1. Field of the Invention

The present invention relates to detection devices, movable body apparatuses, pattern formation apparatuses and pattern formation methods, exposure apparatuses and exposure methods, and device manufacturing methods, and more particularly to a detection device that detects a surface state of a measurement member, a movable body apparatus that is equipped with the detection device, a pattern formation apparatus that is equipped with the movable body apparatus, a pattern formation method of forming a pattern on an object held by a movable body, and an exposure apparatus and an exposure method that expose the object with an energy beam, and a device manufacturing method that uses the pattern formation method described above.

2. Description of the Background Art

Conventionally, in a lithography process for manufacturing electron devices (microdevices) such as semiconductor devices (integrated circuits or the like) and liquid crystal display devices, exposure apparatuses such as a projection exposure apparatus based on a step-and-repeat method (a so-called stepper) and a projection exposure apparatus based on a step-and-scan method (a so-called scanning stepper (which is also called a scanner) are mainly used.

In these steppers, scanners or the like, in general, position measurement of a stage that holds a substrate to be exposed (e.g. a wafer) is performed using a laser interferometer having a high resolution. However, the length of an optical path of a beam of the laser interferometer is as long as around several hundreds mm or more. Further, due to finer patterns to cope with higher integration of semiconductor devices, position control performance with higher precision of the stage has been required. For such a reason, the short term fluctuation of measurement values of the laser interterometer caused by temperature fluctuations (air fluctuations) of the atmosphere on the beam path of the laser interferometer is becoming unignorable now.

Accordingly, recently the technology, in which a linear encoder whose measurement values have smaller short-term fluctuation due to temperature fluctuations (air fluctuations) than the laser interferometer is used, has been proposed (e.g. refer to the pamphlet of International Publication No. 2007/097379 and the corresponding U.S. Patent Application Publication No. 2008/0088843, and the like). In the case where such a linear encoder is used, if a foreign substance exists on a scale, there is the possibility that measurement error occurs or measurement cannot be performed due to the foreign substance.

SUMMARY OF THE INVENTION

The present invention was made under the circumstances described above, and according to a first aspect of the present invention, there is provided a first exposure apparatus that exposes an object held by a movable body with an energy beam, the apparatus comprising: an encoder system of which one of a measurement member and a head member is arranged on the movable body and the other of the members is arranged facing the movable body, and which measures positional information of the movable body using a plurality of heads of the head member that faces the measurement member; and a detection device that detects information on a surface state of the measurement member.

With this apparatus, since detection device detects information on a surface state of the measurement member, deterioration in measurement accuracy of the encoder system caused by the surface state can be suppressed by taking into consideration the surface state (such as the adherence state of foreign substance) of the measurement member. Accordingly, measurement of positional information of the movable body can be performed with high accuracy, and high-precision exposure to an object held on the movable body can be performed.

According to a second aspect of the present invention, there is provided an exposure method of exposing an object held by a movable body with an energy beam, the method comprising: a measurement process of measuring positional information of the movable body, using an encoder system of which one of a measurement member and a head member is arranged on the movable body and the other of the members is arranged facing the movable body, and which measures the positional information using a plurality of heads of the head member that faces the measurement member; and a detection process of detecting information on a surface state of the measurement member using a detection device.

With this method, since information on a surface state of the measurement member is detected using the detection device in the detection process, deterioration in measurement accuracy of the encoder system caused by the surface state can be suppressed by taking into consideration the surface state (such as the adherence state of foreign substance) of the measurement member. Accordingly, measurement of positional information of the movable body can be performed with high accuracy, and high-precision exposure to an object held on the movable body can be performed.

According to a third aspect of the present invention, there is provided a detection device that detects a surface state of a measurement member which is arranged on a movable body and to which a measurement beam used for measurement of positional information of the movable body in a predetermined direction is irradiated, the detection device comprising: an irradiation system that irradiates a light beam to the measurement member; and a detection system that detects the light beam via the measurement member.

With this device, it is possible to detect the surface state contactlessly with respect to the measurement member.

According to a fourth aspect of the present invention, there is provided a first movable body apparatus, comprising: a movable body on which a measurement member is arranged; a measurement device that has a head facing the measurement member and measures positional information of the movable body in the predetermined direction by the head; and the detection device of the present invention that detects a surface state of the measurement member.

With this apparatus, because the detection device detects the surface state of the measurement member contactlessly with respect to the measurement member, a detection operation of the detection device does not hinder movement of the movable body. Further, by taking into consideration the surface state (such as the adherence state of foreign substance) of the measurement member, deterioration in measurement accuracy of the measurement device due to the surface state can be suppressed, which makes it possible to perform high-precision movement control of the movable body.

According to a fifth aspect of the present invention, there is provided a first pattern formation apparatus, comprising: the first movable body apparatus of the present invention in which the movable body holds an object; and a pattern generation device that generates a pattern on the object.

With this apparatus, position control of the movable body (position control of an object) can be performed with high accuracy, and therefore, by the pattern generation device generating a pattern on the object held by the movable body, high-precision pattern generation can be performed on the object.

According to a sixth aspect of the present invention, there is provided a second exposure apparatus that exposes an object with an energy beam and forms a pattern on the object, the apparatus comprising: the first movable body apparatus of the present invention in which the movable body holds the object.

With this apparatus, because measurement of positional information of the movable body can be performed with high accuracy, a pattern can be formed with high accuracy on an object held by the movable body.

According to a seventh aspect of the present invention, there is provided a second movable body apparatus, comprising: a movable body on which a measurement member is arranged; a measurement device that has a head that irradiates a measurement beam to the measurement member when facing the measurement member and receives the measurement beam via the measurement member, and measures positional information of the movable body in a predetermined direction by the head; and a detection device that detects a surface state of the measurement member.

With this apparatus, the detection device detects the surface state of the measurement member, and therefore, by taking into consideration the surface state (such as the adherence state of foreign substance) of the measurement member, deterioration in measurement accuracy of the measurement device due to the surface state can be suppressed. Accordingly, high-precision movement control of the movable body can be performed.

According to an eight aspect of the present invention, there is provided a second pattern formation apparatus, comprising: the second movable body apparatus of the present invention in which the movable body holds an object; and a pattern generation device that generates a pattern on the object.

With this apparatus, position control of the movable body (position control of an object) can be performed with high accuracy, and therefore, by the pattern generation device generating a pattern on the object held by the movable body, high-precision pattern generation can be performed on the object.

According to a ninth aspect of the present invention, there is provided a third exposure apparatus that exposes an object with an energy beam and forms a pattern on the object, the apparatus comprising: the second movable body apparatus of the present invention in which the movable body holds the object.

With this apparatus, because measurement of positional information of the movable body can be performed with high accuracy, a pattern can be formed with high accuracy on an object held by the movable body.

According to a tenth aspect of the present invention, there is provided a third movable body apparatus, comprising: a movable body that moves within a predetermined plane, holding an object mounted on the movable body; a measurement device that has a head that faces one surface of the movable body on which the object is mounted and which is parallel to the plane, and measures positional information of the movable body in a predetermined direction by the head irradiating a measurement beam to an area other than a mounting area of the object on the one surface of the movable body; and a detection device that detects a surface state of the area other than the mounting area of the object on the one surface of the movable body.

With this apparatus, the detection device detects the surface state of an area other than a mounting area of an object on one surface of the movable body, and therefore, by taking into consideration the surface state (such as the adherence state of foreign substance) of the area other than the mounting area of the object on the one surface of the movable body to which a detection beam from the measurement device is irradiated, deterioration in measurement accuracy of the measurement device due to the surface state can be suppressed. This makes it possible to perform high-precision movement control of the movable body in a predetermined direction.

According to an eleventh aspect of the present invention, there is provided a third pattern formation apparatus, comprising: the third movable body apparatus of the present invention; and a pattern generation device that generates a pattern on an object mounted on the movable body.

With this apparatus, position control of the movable body (position control of an object) can be performed with high accuracy, and therefore, by the pattern generation device generating a pattern on the object held by the movable body, high-precision pattern generation can be performed on the object.

According to a twelfth aspect of the present invention, there is provided a first pattern formation method, comprising: a pattern formation process of forming a pattern on an object held by a movable body; and a detection process of detecting a surface state of a measurement member which is arranged on the movable body and to which a measurement beam used for measurement of positional information of the movable body in a predetermined direction is irradiated.

With this method, pattern generation on the object can be performed with high precision in a state where the influence by the surface state (such as the adherence state of foreign substance) of the measurement member is avoided.

According to a thirteenth aspect of the present invention, there is provided a first device manufacturing method, comprising: a process of forming a pattern on an object by the first pattern formation method of the present invention; and a process of applying processing to the object on which the pattern is formed.

According to a fourteenth aspect of the present invention, there is provided a second pattern formation method, comprising: a pattern formation process of forming a pattern on an object held by a movable body; and a foreign substance removal process of removing a foreign substance existing on a surface of a measurement member which is arranged on the movable body and to which a measurement beam used for measurement of positional information of the movable body in a predetermined direction is irradiated.

With this method, because the foreign substance existing on the measurement member arranged on the movable body is removed in the foreign substance removal process, a pattern can be formed on the object without being affected by the foreign substance existing on the measurement member in the pattern formation process.

According to a fifteenth aspect of the present invention, there is provided a second device manufacturing method, comprising: a process of forming a pattern on an object by the second pattern formation method of the present invention; and a process of applying processing to the object on which the pattern is formed.

BRIEF DESCRIPTION OF THE DRAWINGS

In the accompanying drawings.

DESCRIPTION OF THE EMBODIMENTS

An embodiment of the present invention will be described below, with reference to FIGS. 1 to 21.

Figure 1:
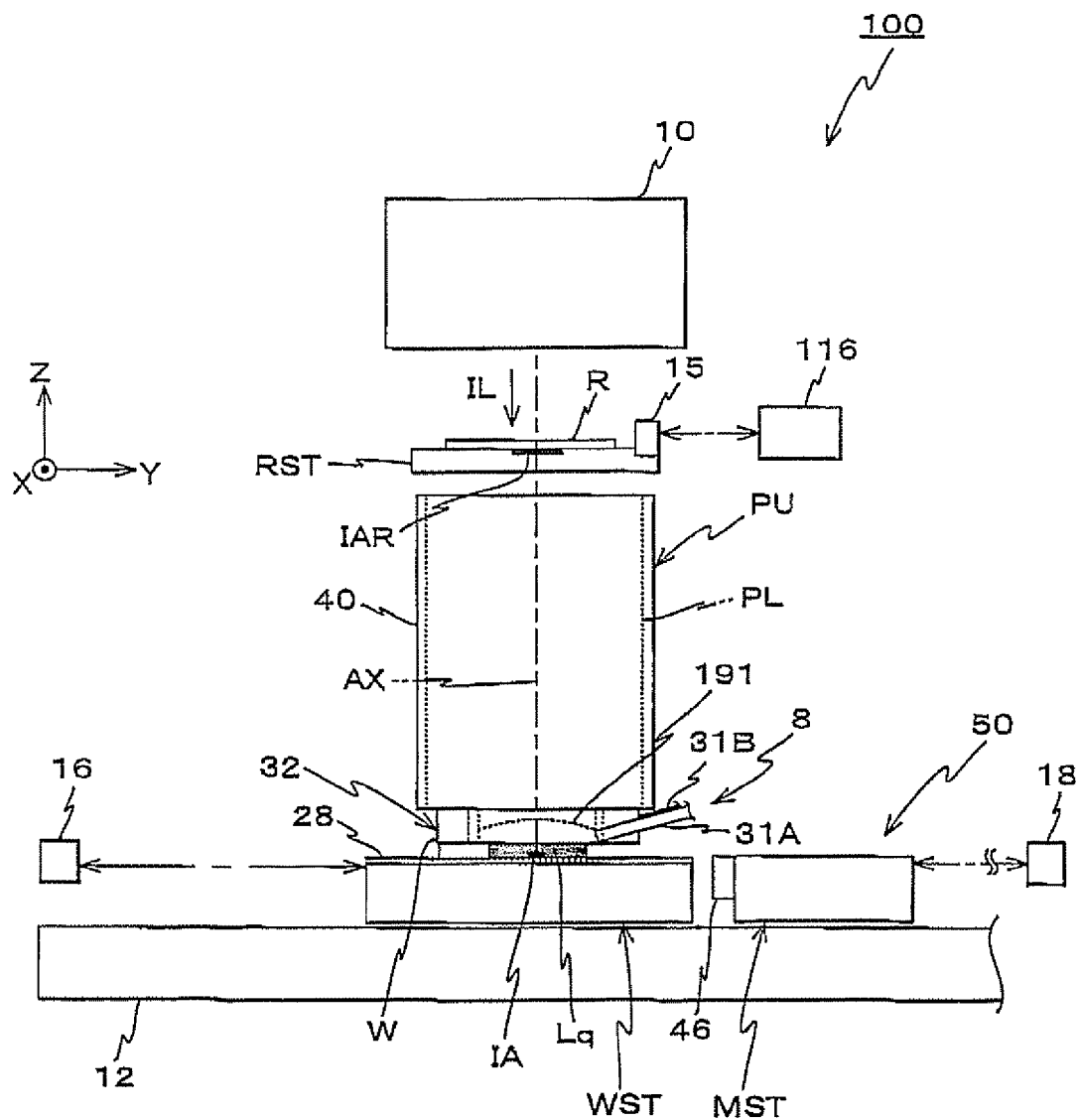
FIG. 1 is a schematic view showing an exposure apparatus related to an embodiment.

FIG. 1 schematically shows a configuration of an exposure apparatus 100 related to the embodiment. Exposure apparatus 100 is a projection exposure apparatus based on a step-and-scan method, that is, a scanner. As will be described later, in the embodiment, a projection optical system PL is arranged, and the following description will be made assuming that a direction parallel to an optical axis AX of projection optical system PL is a Z-axis direction, a direction in which a reticle and a wafer are relatively scanned within a plane orthogonal to the Z-axis direction is a Y-axis direction and a direction that is orthogonal to a Z-axis and a Y-axis is an X-axis direction, and rotation (tilt) directions around the X-axis, the Y-axis and the Z-axis are θx, θy and θz directions respectively.

Exposure apparatus 100 is equipped with an illumination system 10, a reticle stage RST that holds a reticle R that is illuminated by an illumination light for exposure (hereinafter, referred to as an "illumination light" or an "exposure light") IL from illumination system 10, a projection unit PU that includes projection optical system PL that projects illumination light IL emitted from reticle R on a wafer W, a stage device 50 that has a wafer stage WST and a measurement stage MST, their control system, and the like. On wafer stage WST, wafer W is mounted.

Illumination system 10 includes a light source and an illumination optical system that has an illuminance uniformity optical system containing an optical integrator and the like, and a reticle blind and the like (none of which are shown), as is disclosed in, for example, Kokai (Japanese Unexamined Patent Application Publication) No. 2001-313250 (the corresponding U.S. Patent Application Publication No. 2003/0025890) and the like. In illumination system 10, a slit-shaped illumination area IAR that is defined by the reticle blind (the masking system) on reticle R is illuminated by illumination light (exposure light) IL with substantially uniform illuminance. In this case, as illumination light IL, an ArF excimer laser light (wavelength: 193 nm) is used as an example. Further, as the optical integrator, for example, a fly-eye lens, a rod integrator (an internal reflection type integrator), a diffraction optical element or the like can be used.

On reticle stage RST, reticle R having a pattern surface (the lower surface in FIG. 1) on which a circuit pattern and the like are formed is fixed by, for example, vacuum suction. Reticle stage RST is finely drivable within an XY plane and also drivable at designated scanning velocity in a scanning direction (which is the Y-axis direction being a lateral direction of the page surface of FIG. 1), by a reticle stage drive system 11

(not shown in FIG. 1, refer to FIG. 5) including, for example, a linear motor or the like. Positional information of reticle stage RST is constantly measured by a reticle interferometer 116.

Projection unit PU is placed below reticle stage RST in FIG. 1. Projection unit PU includes a barrel 40 and projection optical system PL having a plurality of optical elements that are held in a predetermined positional relation within barrel 40. As projection optical system PL, for example, a dioptric system that is composed of a plurality of lenses (lens elements) that are disposed along optical axis AX direction parallel to the Z-axis direction is used. Projection optical system PL is, for example, both-side telecentric and has a predetermined projection magnification (e.g. one-quarter, one-fifth one-eighth times, or the like). Therefore, when illumination area IAR is illuminated by illumination light IL from illumination system 10, illumination light IL having passed through reticle R whose pattern surface is placed substantially coincidentally with a first surface (an object plane) of projection optical system PL forms a reduced image of a circuit pattern (a reduced image of part of a circuit pattern) of reticle R within illumination area TAR on an area (hereinafter, also referred to as an "exposure area") IA that is conjugate with illumination area IAR, on wafer W, which is placed on the second surface (the image plane) side of projection optical system PL and whose surface is coated with a resist (a photosensitive agent), via projection optical system PL (projection unit PU). Although not shown in the drawing, projection unit PU is mounted on a barrel platform that is supported by three support columns via a vibration isolation mechanism. However, the present invention is not limited thereto, and as is disclosed in, for example, the pamphlet of International Publication No. 2006/038952, projection unit PU may also be supported in a suspended state with respect to a main frame member (not shown) that is placed above projection unit PU, or a base member on which reticle stage RST is placed, or the like.

Incidentally, in exposure apparatus 100 of the embodiment, because exposure applying the liquid immersion method is performed, a catadioptric system containing mirrors and lenses may also be used, in order to satisfy the Petzval condition and also avoid the increase in size of the projection optical system.

Further, in exposure apparatus 100 of the embodiment, in order to perform exposure applying the liquid immersion method, a nozzle unit 32 that constitutes part of a local liquid immersion device 8 is arranged so as to enclose the periphery of the lower end portion of barrel 40 that holds an optical element closest to the image plane side (the wafer W side) that constitutes projection optical system PL, which is a lens (hereinafter, also referred to a "tip lens") 191 in this case. In the embodiment, as is shown in FIG. 1, the lower end surface of nozzle unit 32 is set substantially flush with the lower end surface of tip lens 191. Further, nozzle unit 32 is equipped with a supply opening and a recovery opening of a liquid Lq, a lower surface to which wafer W is placed opposing and at which the recovery opening is arranged, and a supply flow channel and a recovery flow channel that are connected to a liquid supply pipe 31A and a liquid recovery pipe 31B respectively.

In the embodiment, the liquid is supplied from a liquid supply device 5 (not shown in FIG. 1, refer to FIG. 5) to the space between tip lens 191 and wafer W via liquid supply pipe 31A, the supply flow channel and the supply opening, and the liquid is recovered from the space between tip lens 191 and wafer W by a liquid recovery device 6 (not shown in FIG. 1, refer to FIG. 5) via the recovery opening, the recovery flow channel and liquid recovery pipe 31B, so that a constant quantity of liquid Lq (refer to FIG. 2) is held in the space between tip lens 191 and wafer W. In this case, liquid Lq held in the space between tip lens 191 and wafer W is constantly replaced.

In the embodiment, as the liquid described above, pure water (hereinafter, it will simply be referred to as "water" besides the case where specifying is necessary) that transmits the ArF excimer laser light (the light with a wavelength of 193 nm) is to be used. Retractive index n of the water with respect to the ArF excimer laser light is around 1.44. In the water the wavelength of illumination light IL is 193 nm×1/n, shorted to around 134 nm.

As is obvious from the above description, in the embodiment, local liquid immersion device 8 is configured including nozzle unit 32, liquid supply device 5, liquid recovery device 6, liquid supply pipe 31A and liquid recovery pipe 31S, and the like. Incidentally, part of local liquid immersion device 8, for example, at least nozzle unit 32 may also be supported in a suspended state by a main frame (including the barrel platform described above) that holds projection unit PU, or may also be arranged at another frame member that is separate from the main frame. Or, in the case where projection unit PU is supported in a suspended state as is described earlier, nozzle unit 32 may also be supported in a suspended state integrally with projection unit PU, but in the embodiment, nozzle unit 32 is arranged at a measurement frame that is supported in a suspended state independently from projection unit PU. In this case, projection unit PU does not have to be supported in a suspended state Incidentally, also in the case where measurement stage MST is located below projection unit PU, the space between the measurement stage (to be described later) and tip lens 191 can be filled with water in the similar manner to the above-described manner.

Referring back to FIG. 1, stage device 50 is equipped with wafer stage WST and measurement stage MST that are placed on a base board 12, an interferometer system 118 (refer to FIG. 5) including Y-axis interferometers 16 and 18 that measure positional information of stages WST and MST, an encoder system 200 (refer to FIG. 5) that is used to measure positional information of wafer stage WST on exposure or the like, a stage drive system 124 (refer to FIG. 5) that drives stages WST and MST, detection devices $PDX_1$ to $PDX_4$, $PDY_1$ and $PDY_2$ (to be described later, refer to the drawings such as FIGS. 3 and 5) and the like.

On the bottom surface of each of wafer stage WST and measurement stage MST, a noncontact bearing (not shown), for example, a vacuum preload type hydrostatic air bearing (hereinafter, referred to as an "air pad") is arranged at a plurality of positions. Wafer stage WST and measurement stage MST are supported in a noncontact manner via a clearance of around several μm above base board 12, by static pressure of pressurized air that is blown out from the air pad toward the upper surface of base board 12. Further, stages WST and MST are drivable independently from each other at least in the Y-axis direction and the X-axis direction by stage drive system 124.

Figure 2:
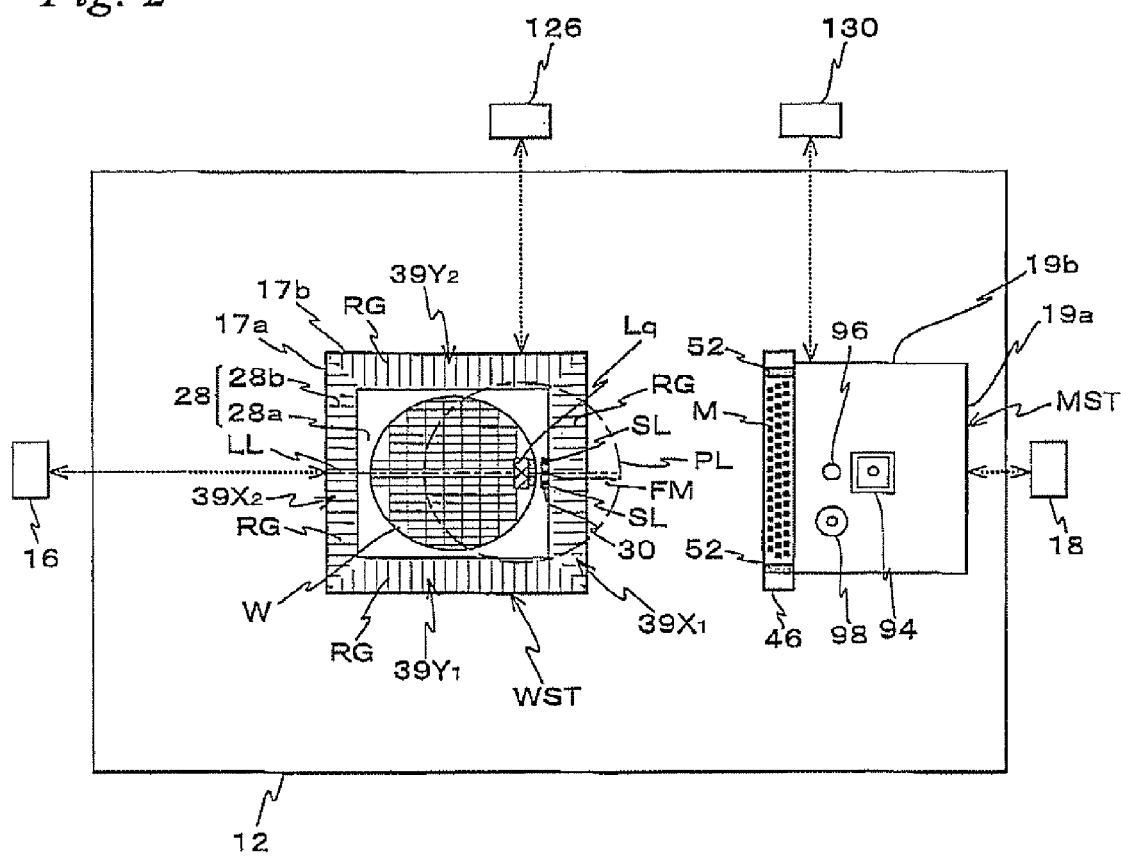
FIG. 2 is a plan view showing a stage device in FIG. 1.

On wafer stage WST, a wafer holder (not shown) that holds wafer W by vacuum suction or the like is arranged. The wafer holder may also be formed integrally with wafer stage WST, but in the embodiment, the wafer holder and wafer stage WST are separately configured, and the wafer holder is fixed inside a recessed portion of wafer stage WST, for example, by vacuum suction or the like. Further, on the upper surface of wafer stage WST, a plate (liquid repellent plate) 28 is arranged, which has the surface (the liquid repellent surface)

substantially flush with the surface of a wafer mounted on the wafer holder to which liquid repellent treatment with respect to liquid Lq is applied, has a rectangular outer shape (contour), and has a circular opening that is formed in the center portion and is slightly larger than the wafer holder (a mounting area of the wafer). Plate 28 is made of materials with a low coefficient of thermal expansion, for example, glasses or ceramics (such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon®), acrylic series resin materials, silicon series resin materials, or the like. Further, as is shown in FIG. 2 that is a plan view of stage device 50, plate 28 has a first liquid repellent area 28a whose outer shape (contour) is rectangular enclosing the circular opening, and a second liquid repellent area 28b that has a rectangular frame (loop) shape placed on the periphery of first liquid repellent area 28a. On first liquid repellent area 28a, for example, when an exposure operation is performed, at least part of a liquid immersion area 14 (e.g. refer to FIG. 3) protruding from the surface of the wafer is formed, and on second liquid repellent area 28b, scales for the encoder system (to be described later) are formed. Incidentally, at least part of the surface of plate 28 does not have to be flush with the surface of the wafer, that is, may be different in height from the surface of the wafer. Further, plate 28 may be a single plate, but in the embodiment, plate 28 is configured by combining a plurality of plates, for example, first and second liquid repellent plates that correspond to first liquid repellent area 28a and second liquid repellent area 28b respectively. In the embodiment, pure water is used as liquid Lq as is described above, and therefore hereinafter first liquid repellent area 28a and second liquid repellent area 28b are also referred to as first water repellent plate 28a and second water repellent plate 28b respectively.

In this case, exposure light IL is irradiated to first water repellent plate 28a on the inner side, while exposure light IL is hardly irradiated to second water repellent plate 28b on the outer side. Taking this fact into consideration, in the embodiment, a first water repellent area to which water repellent coat having sufficient resistance to exposure light IL (a light in a vacuum ultraviolet region, in this case) is applied is formed on the surface of first water repellent plate 28a, and a second water repellent area to which water repellent coat having resistance to exposure light IL inferior to the first water repellent area is applied is formed on the surface of second water repellent plate 28b. Since it is difficult in general to apply water repellent coat having sufficient resistance to exposure light IL (a light in a vacuum ultraviolet region, in this case) to a glass plate, it is effective to separate the water repellent plate into two sections in this manner, i.e. first water repellent plate 28a and second water repellent plate 28b on the periphery thereof. Incidentally, the present invention is not limited thereto, and two types of water repellent coat that have different resistance to exposure light IL may also be applied on the upper surface of the same plate in order to form the first water repellent area and the second water repellent area. Further, the same kind of water repellent coat may be applied to the first and second water repellent areas. For example, only one water repellent area may also be formed on the same plate.

Further, as is obvious from FIG. 2, at the end portion on the +Y side of first water repellent plate 28a, a rectangular cutout is formed in the center portion in the X-axis direction, and a measurement plate 30 is embedded inside the rectangular space (inside the cutout) that is enclosed by the cutout and second water repellent plate 28b. A fiducial mark FM is formed in the center in the longitudinal direction of measurement plate 30 (on a centerline LL of wafer stage WST), and a pair of aerial image measurement slit patterns SL (slit-shaped measurement patterns) are formed in the symmetrical placement with respect to the center of fiducial mark FM on one side and the other side in the X-axis direction of fiducial mark FM. As each of aerial image measurement slit patterns St, an L-shaped slit pattern having sides along the Y-axis direction and X-axis direction, or two linear slit patterns extending in the X-axis direction and the Y-axis direction respectively can be used, as an example. Inside wafer stage WST below aerial image measurement slit patterns SL, an optical system and the like that constitute an aerial image measurement device 45 (refer to FIG. 5) together with slit patterns SL are arranged.

Figure 7A:
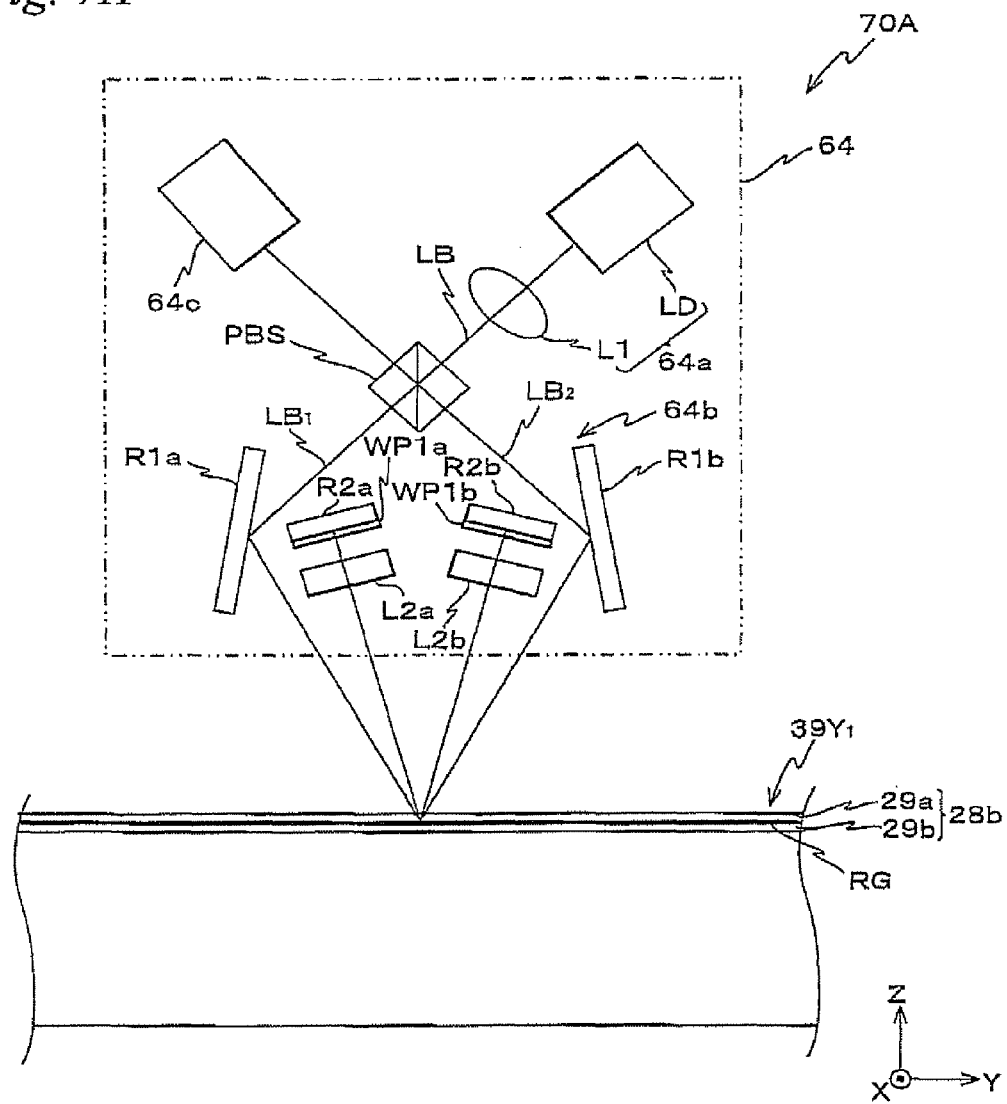
FIG. 7A is a view showing an example of a configuration of an encoder.

As is shown in FIG. 7A, in actual, second water repellent plate 28b is formed by two plate-shaped members 29a and 29b being stuck together. On the upper surface (the surface on the +Z side) of plate-shaped member 29b located on the lower side, many grating lines of diffract Ion grating RG are arranged in a predetermined pitch along each of the four sides of the surface. To be more specific, as is shown in FIG. 2, in areas on one side and the other side in the X-axis direction (on both sides in the vertical direction in FIG. 2) of second water repellent plate 28b (plate-shaped member 29b), Y scales $39Y_1$ and $39Y_2$ are formed respectively. Each of Y scales $39Y_1$ and $39Y_2$ is configured of, for example, a reflective grating (e.g. a diffraction grating) having a periodic direction in the Y-axis direction, in which the grating lines having the longitudinal directions in the X-axis direction are formed in a predetermined pitch along a direction parallel to the Y-axis (the Y-axis direction). Similarly, in areas on one side and the other side in the Y-axis direction (on both sides in the lateral direction in FIG. 2) of second water repellent plate 28b, X scales $39X_1$ and $39X_2$ are formed respectively. Each of X scales $39X_1$ and $39X_2$ is configured of, for example, a reflective grating (e.g. a diffraction grating) having a periodic direction in the X-axis direction, in which the grating lines having the longitudinal di reactions in the Y-axis direction are formed in a predetermined pitch along a direction parallel to the X-axis (the X-axis direction) in the embodiment, damage or the like of diffraction grating RG can be prevented because second water repellent plate 28b is constituted by two plate-shaped members 29a and 29b as is described above and plate-shaped member 29a on the upper side covers diffraction grating RG. Incidentally, the pitch of the grating is shown much wider in FIG. 2 than the actual pitch, for the sake of convenience. The same is true also in other drawings.

Mirror finish is severally applied to the −Y end surface and the −X end surface of wafer stage WST, and a reflection surface 17a and a reflection surface 17b shown in FIG. 2 are formed. By severally projecting an interferometer beam (a measurement beam) to reflection surface 17a and reflection surface 17b and receiving a reflected light of each beam, Y-axis interferometer 16 and an X-axis interferometer 126 (X-axis interferometer 126 is not shown in FIG. 1, refer to FIG. 2) of interferometer system 118 (refer to FIG. 5) measure a displacement of each reflection surface from a reference position (generally, a fixed mirror is placed on the side surface of projection unit PU, and the surface is used as a reference surface), that is, positional information of wafer stage WST within the XY plane, and the measurement values are supplied to main controller 20. In the embodiment, as Y-axis interferometer 16 and X-axis interferometer 126, a multiaxial interferometer having a plurality of measurement axes is used. Based on the measurement values of Y-axis interferometer 16 and X-axis interferometer 126, main controller 20 can also measure rotational information in the θx direction (i.e. pitching), rotational information in the θy direction (i.e. rolling) and rotational information in the θz direction (i.e. yawing), in addition to the X-position and the Y-position of wafer stage WST. In the embodiment, however, positional information of wafer stage WST within the XY plane (including the rotational information in the θz direction) is mainly measured by each encoder of the encoder system (to be described later) that uses the Y scales and the X scales described above. And, the measurement values of interferometers 16 and 126 are secondarily used in the cases such as when long-term fluctuation of the measurement values of each encoder (e.g. due to deformation of the scales due to time passage, or the like) is corrected (calibrated). Further, Y-axis interferometer 16 is used to measure the Y-position of wafer stage WST and the like in the vicinity of an unloading position and a loading position (to be described later) for wafer exchange. Further, also for movement of wafer stage WST, for example, between a loading operation and an alignment operation and/or between an exposure operation and an unloading operation, measurement information of interferometer system 118, that is, at least one of positional information in directions of five degrees of freedom (the X-axis, Y-axis, θx, θy and θz directions) is used. Incidentally, at least part of interferometer system 118 (e.g. an optical system or the like) may be arranged at the main frame that holds projection unit PU, or may also be arranged integrally with projection unit PU that is supported in a suspended state as is described above, but, in the embodiment, interferometer system 118 is to be arranged at the measurement frame described above.

Incidentally, in the embodiment, as wafer stage WST, a single stage that is movable in directions of six degrees of freedom is employed, but as wafer stage WST, a configuration may also be employed, which includes a stage main section that is freely movable within the XY plane and a water table that is mounted on the stage main section and is finely drivable in the Z-axis direction, the θx direction and θy direction relative to the stage main section. Further, instead of reflection surface 17a and reflection surface 17b, a movable mirror composed of a planar mirror may also be arranged at wafer stage WST. Moreover, positional information of wafer stage WST is to be measured with a reflection surface of the fixed mirror arranged at projection unit PU serving as a reference surface, but the position where the reference surface is placed is not limited to projection unit PU, and positional information of wafer stage WST does not necessarily have to be measured using the fixed mirror.

Further, in the embodiment, positional information of wafer stage WST measured by interferometer system 118 is not used in the exposure operation or the alignment operation (to be described later) but is to be used mainly in the calibration operation (i.e. calibration of measurement values) of each encoder or the like, but measurement information of interferometer system 118 (i.e. at least one of positional information in directions of five degrees of freedom) may also be used in, for example, the operations such as the exposure operation and/or the alignment operation. In the embodiment, the encoder system measures positional information of wafer stage WST in directions of three degrees of freedom, that is, positional information in the X-axis, Y-axis and θz directions, using at least three encoders. Thus, in the operations such as the exposure operation, among measurement information of interferometer system 118, only positional information in a direction different from the measurement directions (the X-axis, Y-axis and θz directions) of positional information of wafer stage WST by the encoder may be used, or in addition to the positional information in the different direction, positional information in the same direction as the measurement directions of the encoder (i.e. at least one of the X-axis, Y-axis and θz directions) may also be used. Further, interferometer system 118 may be capable of measuring positional information of wafer stage WST in the Z-axis direction. In this case, the positional information in the Z-axis direction may also be used in the operations such as the exposure operation.

Measurement stage MST has various types of measurement members and is drivable in directions of six degrees of freedom. As the measurement members, for example, as is shown in FIG. 2, an uneven illuminance measuring sensor 94 that has a pinhole-shaped light-receiving section that receives illumination light IL on an image plane of projection optical system PL, an aerial image measuring instrument 96 that measures an aerial image (a projected image) of a pattern that is projected by projection optical system PL, and a wavefront aberration measuring instrument 98 based on the Shack-Hartman method that is disclosed in, for example, the pamphlet of International Publication No. 03/065428 and the like are employed. As wavefront aberration measuring instrument 98, the one disclosed in, for example, the pamphlet of International Publication No. 99/60361 (the corresponding European Patent Application Publication No. 1 079 223) can also be used.

As uneven illuminance measuring sensor 94, a configuration similar to the one that is disclosed in, for example, Kokai (Japanese Unexamined Patent Application Publication) No. 57-117238 (the corresponding U.S. Pat. No. 4,465,368) and the like can be used. Further, as aerial image measuring instrument 96, a configuration similar to the one that is disclosed in, for example, Kokai (Japanese Unexamined Patent Application Publication) No. 2002-014005 (the corresponding U.S. Patent Application Publication No. 2002/0041377) and the like can be used. Incidentally, three measurement members (94, 96 and 98) are to be arranged at measurement stage MST in the embodiment, however, the types and/or the number of measurement members are/is not limited to them. As the measurement members, for example, measurement members such as a transmittance measuring instrument that measures a transmittance of projection optical system PL, and/or a measuring instrument that observes local liquid immersion device 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

In addition to each of the sensors described above, an illuminance monitor that has a light-receiving section having a predetermined area size that receives illumination light IL on the image plane of projection optical system PL may also be employed, which is disclosed in, for example, Kokai (Japanese Unexamined Patent Application Publication) No. 11-016816 (the corresponding U.S. Patent Application Publication No. 2002/0061469) and the like, and this illuminance monitor is also preferably placed on the centerline.

Incidentally, in the embodiment, liquid immersion exposure is performed in which wafer W is exposed with exposure light (illumination light) IL via projection optical system PL and liquid (water) Lq, and accordingly uneven illuminance measuring sensor 94 (and the illuminance monitor), aerial image measuring instrument 96 and wavefront aberration measuring instrument 98 that are used in measurement using illumination light IL receive illumination light IL via projection optical system PL and water. Further, only part of each sensor, for example, the optical system or the like may be mounted on measurement stage MST, or the entire sensor may be placed on measurement stage MST.

On the side surface on the −Y side of measurement stage MST, a confidential bar (hereinafter, shortly referred to as a "CD bar") 46 as a reference member having a rectangular parallelepiped shape is arranged extending in the X-axis direction. CD bar 46 is kinematically supported on measurement stage MST by full-kinematic mount structure. Incidentally, CD bar 46 is also referred to as a fiducial bar (shortly referred to as a "FD bar").

Since CD bar 46 serves as a prototype standard (a measurement standard), optical glass ceramics with a low coefficient of thermal expansion, such as Zerodur (the brand name) of Schott AG are employed as the materials. The flatness degree of the upper surface (the surface) of CD bar 46 is set high to be around the same level as a so-called datum plane plate. Further, as is shown in FIG. 2, a reference grating (e.g. a diffraction grating) 52 having a periodic direction in the Y-axis direction is respectively formed in the vicinity of the end portions on one side and the other side in the longitudinal direction of CD bar 46. The pair of reference gratings 52 are formed apart from each other at a predetermined distance in the symmetrical placement with respect to the center in the X-axis direction of CD bar 46, that is, a centerline CL.

Further, on the upper surface of CD bar 46, a plurality of reference marks M are formed as is shown in FIG. 2. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by the primary alignment system and secondary alignment systems (to be described later) is used. Reference mark M may also be different in shape (constitution) from fiducial mark FM described earlier, but in the embodiment, reference mark M and fiducial mark FM have the same constitution and also they have the same constitution with that of the alignment mark on wafer W. Incidentally, in the embodiment, the surface of CD bar 46 and the surface of measurement stage MST (which may include the measurement members described above) are also covered with a liquid repellent film (a water repellent film) severally.

Also on the +Y end surface and the −X end surface of measurement stage MST, reflection surfaces 19a and 19b are formed similar to wafer stage WST as described above (refer to FIG. 2). By projecting an interferometer beam (a measurement beam), as is shown in FIG. 2, to reflection surfaces 19a and 19b and receiving a reflected light of each interferometer beam, Y-axis interferometer 18 and an X-axis interferometer 130 (X-axis interferometer 130 is not shown in FIG. 1, refer to FIG. 2) of interferometer system 118 (refer to FIG. 5) measure a displacement of each reflection surface from a reference position, that is, positional information of measurement stage MST (e.g. including at least positional information in the X-axis and Y-axis directions and rotational information in the θz direction), and the measurement values are supplied to main controller 20.

Figure 3:
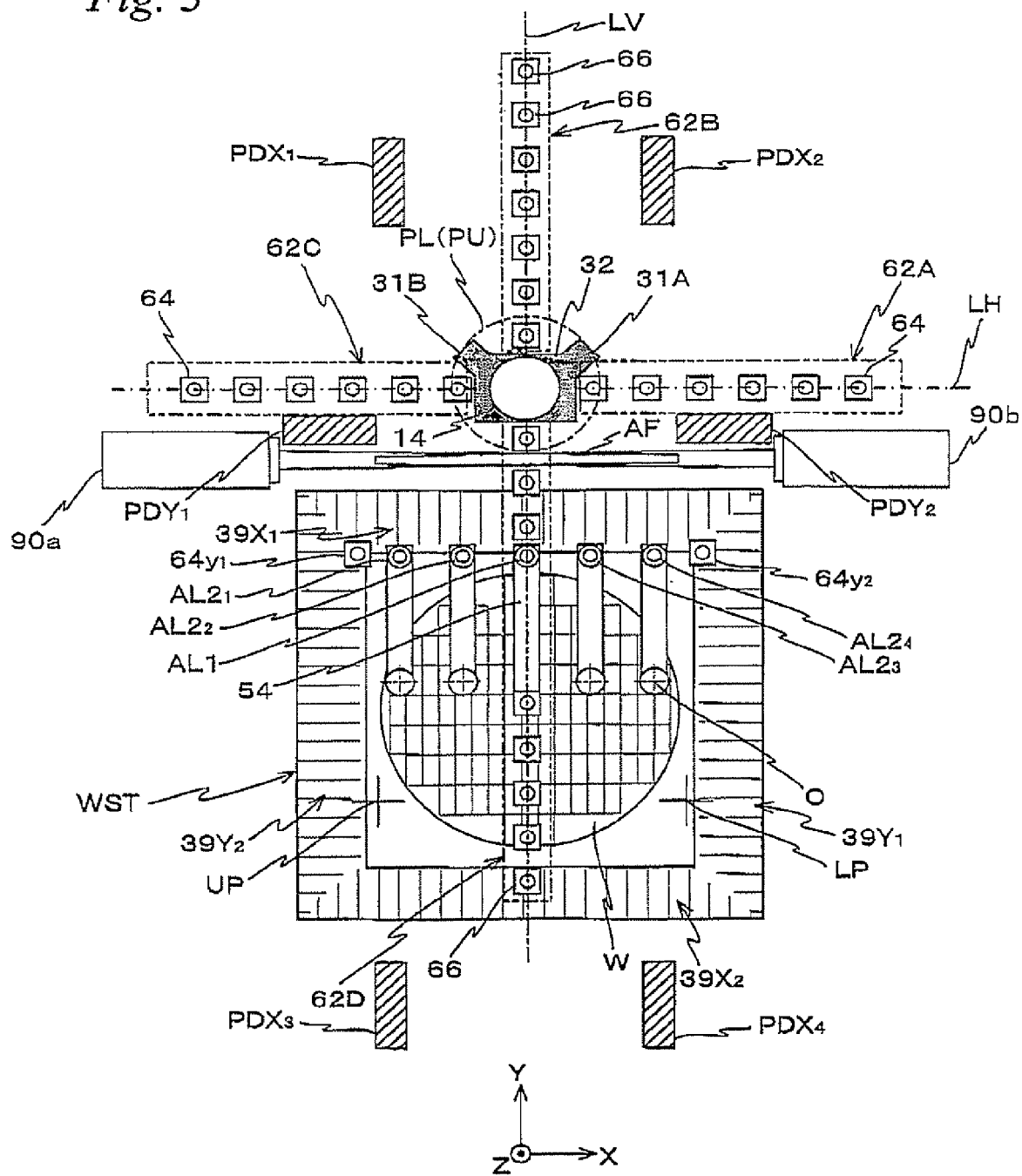
FIG. 3 is a plan view showing the placement of various measurement devices (such as encoders, alignment systems, and a multipoint AF system) that are equipped in the exposure apparatus in FIG. 1.

In exposure apparatus 100 of the embodiment, in actual, as is shown in FIG. 3, on a straight line LV passing through the center of projection unit PU and being parallel to the Y-axis, primary alignment system AL1 having a detection center at a position that is spaced apart at a predetermined distance on the −Y side from the center of projection unit PU is arranged in a state of being supported by a support member 54, although omitted in FIGS. 1 and 2 from the viewpoint of avoiding intricacy of the drawings. Further, on one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to straight line LV are respectively arranged. Each secondary alignment system $AL2_n$, (n=1 to 4) is capable of turning around a rotation center O as the center in the page surface, and the X-position of secondary alignment system $AL2_n$ is adjusted by the turn. Incidentally, five alignment systems AL1 and $AL2_1$ to $AL2_4$ are fixed to the lower surface of the main frame that holds projection unit PU. However, the present invention is not limited thereto, and five alignment systems AL1 and $AL2_1$ to $AL2_4$ may also be arranged, for example, at the measurement frame described above.

In the embodiment, as each of primary alignment system AL1 and four secondary alignment systems $AL2_1$ to $AL2_4$, for example, an FIA (Field Image Alignment) system based on an image processing method is used that irradiates a broadband detection beam that does not expose the resist on a wafer to a subject mark, and captures an image of the subject mark formed on a light-receiving plane by the reflected light from the subject mark and an image of an index (an index pattern on an index plate arranged within each alignment system, not shown), using an imaging device (such as CCD), and then outputs their imaging signals. The imaging signal from each of primary alignment system AL1 and four secondary alignment systems $AL2_1$ to $AL2_4$ is supplied to main controller 20 in FIG. 5.

Next, encoder system 200 in exposure apparatus 100 of the embodiment will be described referring to FIG. 3. Incidentally, in FIG. 3, measurement stage MST is omitted and a liquid immersion area that is formed by water Lq held in the space between measurement stage MST and tip lens 191 is denoted by a reference sign 14.

As is shown in FIG. 3, in exposure apparatus 100 of the embodiment, four head units 62A to 62D of the encoder system are placed in a state of surrounding the periphery of nozzle unit 32 described above. Although omitted in the drawings such as FIG. 3 from the viewpoint of avoiding intricacy of the drawings, in actual head units 62A to 62D are fixed to the main frame that holds projection unit PU described above in a suspended state via a support member. Incidentally, for example, in the case where projection unit PU is supported in a suspended state, head units 62A to 62D may be supported in a suspended state integrally with projection unit PU, or may be arranged at the measurement frame described above, Head units 62A and 62C are placed on the +X side and the −X side of projection unit PU respectively having the longitudinal direction in the X-axis direction, and also symmetrically with respect to optical axis AX of projection optical system PL at the same distance spaced apart from optical axis AX. Further, head units 62B and 62D are placed on the +Y side and the −Y side of projection unit PU respectively having the longitudinal direction in the Y-axis direction, and also at the same distance spaced apart from optical axis AX of projection optical system PL.

As is shown in FIG. 3, each of head units 62A and 62C is equipped with a plurality (six in this case) of Y heads 64 that are placed at a predetermined distance on straight line LH that passes through optical axis AX of projection optical system PL along the X-axis direction and also is parallel with the X-axis. Head unit 62A constitutes a multiple-lens (six-lens in this case) Y linear encoder (hereinafter, shortly referred to as a "Y encoder" or an "encoder" as needed) 70A (refer to FIG. 5) that measures the position in the Y-axis direction (the Y-position) of wafer stage WST using Y scale $39Y_1$ described above. Similarly, head unit 62C constitutes a multiple-lens (six-lens in this case) Y linear encoder 70C (refer to FIG. 5) that measures the Y-position of wafer stage WST using Y scale 39Y$_2$ described above. In this case, a distance between adjacent Y heads 64 (i.e. the measurement beams) that are equipped in head units 62A and 62C is set shorter than a width of Y scales 39Y$_1$ and 39Y$_2$ described above in the X-axis direction (to be more preciser the length of the grating line). Further, out of a plurality of Y heads 64 that are equipped in each of head units 62A and 62C, Y head 64 located innermost is fixed to the lower end portion of barrel 40 of projection optical system PL (to be more precise, to the side of nozzle unit 32 enclosing tip lens 191) so as to be placed as close as possible to the optical axis of projection optical system PL.

Head units 62A and 62C are equipped with six Z sensors 76$_1$ to 76$_6$ and 74$_1$ to 74$_6$ (not shown in FIG. 3, refer to FIG. 5) respectively, which are arranged at the same X-positions as Y heads 64 equipped in head units 62A and 62C respectively but whose Y-positions are apart from Y heads 64 at a predetermined distance to the +Y side.

Figure 5:
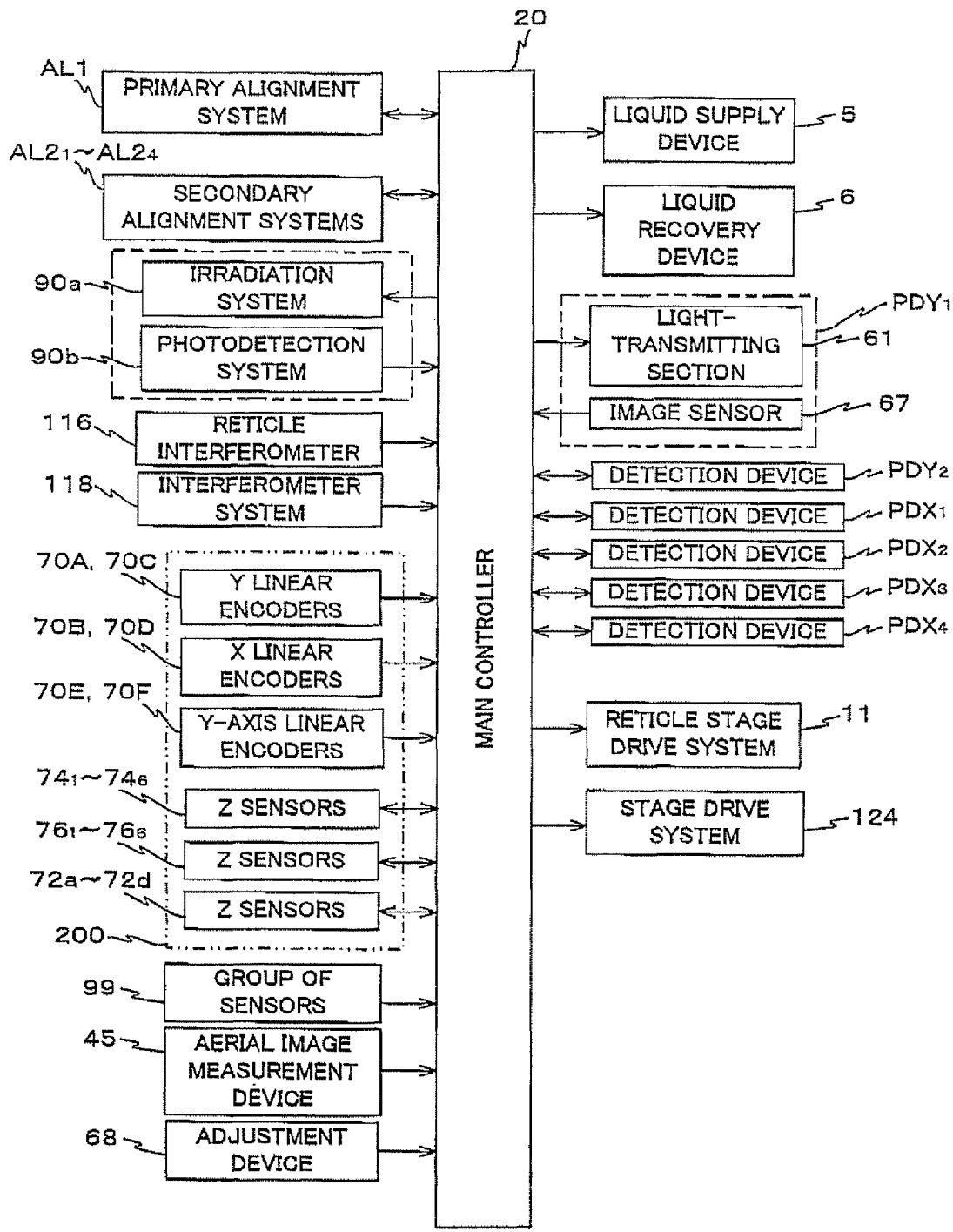
FIG. 5 is a block diagram showing a main configuration of a control system of the exposure apparatus related to the embodiment.

As is shown in FIG. 5; Z sensors 74$_1$ to 74$_6$ and 76$_1$ to 76$_6$ are connected to main controller 20 via a processor (not shown). Z sensors 72a to 72d (their placement will be described later) are also connected to main controller 20 via the processor.

As each of the Z sensors, a sensor that irradiates a light to wafer stage WST from above and receives the reflected light, thereby measuring positional information of the upper surface of wafer stage WST (in the embodiment, the measurement surface of the Y scale which is subject to measurement (the surface subject to measurement)) in the Z-axis direction orthogonal to the XY plane, at the irradiation point of the light, that is, a displacement sensor based on an optical method (a sensor based on an optical pickup method) having a configuration like an optical pickup used in a CD drive device is used as an example.

Main controller 20 selects an arbitrary Z sensor from among Z sensors 72a to 72d, Z sensors 74$_1$ to 74$_6$ and Z sensors 76$_1$ to 76$_6$ via the processor to make the arbitrary Z sensor be in an operating condition, and receives surface position information detected by the Z sensor in the operating condition.

To be more specific, each Z sensor is equipped with a focus sensor, a sensor main section that houses the focus sensor and a drive section that drives the sensor main section in the Z-axis direction, and a measurement section that measures the displacement of the sensor main section in the Z-axis direction, and the like (none of which are shown).

As the focus sensor, a displacement sensor based on an optical method similar to the optical pickup that optically reads the displacement of the surface subject to measurement by irradiating a detection beam to the surface subject to measurement and receiving the reflected light is used. The output signal of the focus sensor (which is also called focus error) is sent to the drive section. According to the output signal from the focus sensor, the drive section drives the sensor main section in the Z-axis direction so as to keep a distance between the sensor main section and the surface subject to measurement constant (to be more precise, so as to keep the surface subject to measurement at the best focus position of an optical system of the focus sensor). With this operation, the sensor main section follows the displacement of the surface subject to measurement in the Z-axis direction and the focus-lock state is maintained.

As the measurement section, in the embodiment, an encoder based on a diffraction interference method is used as an example. The measurement section reads the displacement of the sensor main section in the Z-axis direction.

In the embodiment, as is described above, in the focus-lock state, the sensor main section is displaced in the Z-axis direction so that a distance between the sensor main section and the surface subject to measurement is kept constant. Accordingly, by the encoder head of the measurement section measuring the displacement of the sensor main section in the Z-axis direction, the surface position (the Z-position) of the surface subject to measurement is measured. The measurement values of the encoder head of the measurement section are supplied to main controller 20 via the processor described above as the measurement values of the Z sensor.

As is shown in FIG. 3, head unit 62B is equipped with a plurality (seven in this case) of X heads 66 that are placed on straight line LV at a predetermined distance along the Y-axis direction. Further, head unit 62D is equipped with a plurality (eleven in this case, out of eleven X heads, however, three X heads that overlap primary alignment system AL1 are not shown in FIG. 3) of X heads 66 that are placed on straight line LV at a predetermined distance. Head unit 623 constitutes a multiple-lens (seven-lens, in this case) X linear encoder (hereinafter, shortly referred to as an "X encoder" or an "encoder" as needed) 70B (refer to FIG. 5) that measures the position in the X-axis direction (the X-position) of wafer stage WST using X scale 39X$_1$ described above. Further, head unit 62D constitutes a multiple-lens (eleven-lens, in this case) X linear encoder 70D (refer to FIG. 5) that measures the X-position of wafer stage WST using X scale 39X$_2$ described above. Further, in the embodiment, for example, when alignment (to be described later) or the like is performed, two X heads 66 out of eleven X heads 66 that are equipped in head unit 62D simultaneously face X scale 39X$_1$ and X scale 39X$_2$ respectively in some cases. In these cases, either of X scale 39X$_1$ and X head 66 facing X scale 39X$_1$, or X scale 39X$_2$ and X head 66 facing X scale 39X$_2$ may be used. In either case, X linear encoder 70D is constituted by the X head 66 of head unit 62D facing the X scale.

Herein, some of eleven X heads 66, in this case, three X heads are attached below support member 54 that supports primary alignment system AL1. Further, a distance between adjacent X heads 66 (i.e. measurement beams) that are equipped in each of head units 62B and 62D is set shorter than a width in the Y-axis direction of X scales 39X$_1$ and 39X$_2$ described above (to be more precise, the length of the grating line). Further, X head 66 located innermost out of a plurality of X heads 66 that are equipped in each of head units 62B and 62D is fixed to the lower end portion of the barrel of projection optical system PL (to be more precise, to the side of nozzle unit 32 enclosing tip lens 191) so as to be placed as close as possible to the optical axis of projection optical system PL.

Moreover, on the −X side of secondary alignment system AL2$_1$ and on the +X side of secondary alignment system AL2$_4$, Y heads 64y$_1$ and 64y$_2$ are respectively arranged, whose detection points are placed on a straight line parallel to the X-axis that passes through the detection center of primary alignment system AL1 and are substantially symmetrically placed with respect to the detection center. The distance between Y heads 64y$_1$ and 64y$_2$ is set substantially equal to the distance between a pair of reference gratings 52 on CD bar 46 described previously. Y heads 64y$_1$ and 64y$_2$ face Y scales 39y$_2$ and 39y$_1$ respectively in the state show in FIG. 3 where the center of wafer W on wafer stage WST is on straight line LV. On the alignment operation (to be described later) or the like, Y scales 39y$_2$ and 39y$_1$ are placed facing Y heads 64y$_1$ and 64y$_2$ respectively, and the Y-position (and the θz rotation) of wafer stage WST is measured by Y heads 64y$_1$ and 64y$_2$ (i.e. Y encoders 70E and 70F (refer to FIG. 5) constituted by Y heads 64y$_1$ and 64y$_2$).

Further, in the embodiment, when baseline measurement of the secondary alignment systems (to be described later) or the like is performed, Y heads $64y_1$ and $64y_2$ face a pair of reference gratings 52 of CD bar 46 respectively, and the Y-position of CD bar 46 is measured at the position of each of reference gratings 52 by Y heads $64y_1$ and $64y_2$ facing the pair of reference gratings 52. In the following description, encoders that are constituted by Y heads $64y_1$ and $64y_2$ facing reference gratings 52 respectively are referred to as Y-axis linear encoders $70E_2$ and $70F_2$. Further, in order to distinguish, the Y encoders that are constituted by Y heads $64y_1$ and $64y_2$ that face Y scales $39Y_2$ and $39Y_1$ are referred to as Y encoders $70E_1$ and $70F_3$.

The measurement values of linear encoders 70A to 70F described above are supplied to main controller 20, and main controller 20 controls the position of wafer stage WST within the XY plane based on the measurement values of linear encoders 70A to 70D, and also controls the rotation of CD bar 46 in the θz direction based on the measurement values of linear encoders 70E and 70F.

Further, as is shown in FIG. 3, at exposure apparatus 100 (stage device 50) of the embodiment, six detection devices $PDX_1$ to $PDX_4$, $PDY_1$ and $PDY_2$ (the hatching are drawn in FIG. 3) are arranged that are used to detect the surface state (e.g. the existence state of foreign substance or the like) of scales $39X_1$, $39X_2$, $39Y_1$ and $39Y_2$, and a pair of reference gratings 52 on CD bar 46. Detection devices $PDX_1$ to $PDX_4$, $PDY_1$ and $PDY_2$ may be supported in a suspended state by the main frame (including the barrel platform described above) that holds projection unit PU, or may be fixed to another frame member that is separate from the main frame.

Out of the six detection devices, detection device $PDX_1$ is arranged at a position that is on the +Y side and on the -X side of projection unit PU, and detection device $PDX_2$ is arranged at a position that is on the +Y side and on the +X side of projection unit PU and is bilaterally-symmetric with detection device $PDX_1$ with reference to straight line LV. Moreover, detection device $PDX_3$ is arranged at a position that is on the -Y side and on the -X side of projection unit PU, and detection device $PDX_1$ is arranged at a position that is bilaterally-symmetric with detection device $PDX_3$ with reference to straight line LV. Further, detection device $PDY_1$ is placed at a position that is on the -Y side of head unit 62C and on the +Y side of an irradiation system 90a (to be described later) r and detection device $PDY_2$ is placed at a position that is on the -Y side of head unit 62A and on the +Y side of a photodetection system 90b (to be described later) and is bilaterally-symmetric with detection device $PDY_1$ with reference to straight line LV.

Figure 4A:
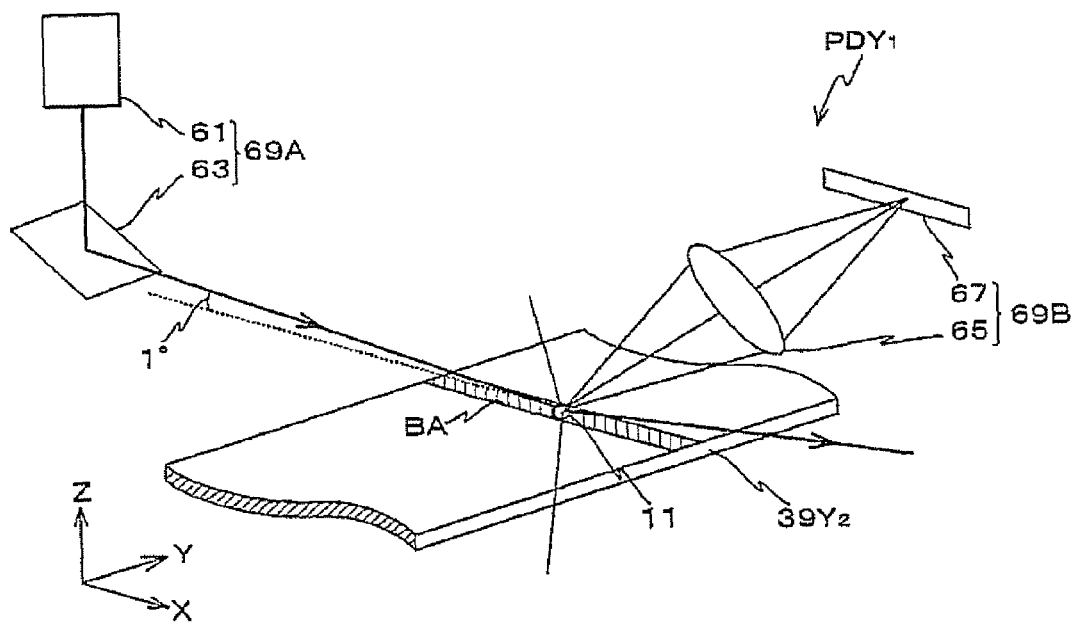
FIG. 4A is a perspective view showing a configuration of a detection device in FIG. 3.

Detection device $PDY_1$ includes an irradiation system 69A that irradiates a detection beam to the surface of scale $39Y_2$ and a photodetection system 69B that receives the detection beam scattered at the surface of scale $39Y_2$, as is shown in FIG. 4A.

Irradiation system 69A includes a light-transmitting section 61 including, for example, a laser light source, a collimator lens, an irradiation light adjusting member, an anomorphic prism, a diaphragm and the like, and a mirror 63. The laser light source is a semiconductor laser that emits a detection beam having a wavelength of, for example, around 780 nm.

Figure 4B:
FIG. 4B is a view showing an incident state of a detection beam emitted from a light-transmitting system in FIG. 4 with respect to a scale.

The detection beam emitted from light-transmitting section 61 is reflected off mirror 63 and is incident on the surface of scale $39Y_2$ at an incident angle close to 90 degrees (89 degrees in FIG. 4). That is, the detection beam is incident substantially parallel to the surface of scale $39Y_2$, and therefore, as is shown in FIG. 4B, the detection beam is irradiated to a band-shaped irradiation area BA that extends on the substantially entire area in the X-axis direction of the surface of scale $39Y_2$. Then, in the case where a foreign substance (a particle) 11 exists on the surface of scale $39Y_2$ as is shown in FIG. 4A, the detection beam irradiated to foreign substance 11 is scattered Photodetection system 69B includes a photodetection lens 65 and an image sensor 67 as is shown in FIG. 4A. As image sensor 67, for example, a photoelectric detector such as a one-dimensional CCD (Charge-Coupled Device) or the like is used.

In photodetection system 69B, image sensor 67 receives the scattered light that is incident on photodetection lens 65 out of the scattered lights that have been scattered at foreign substance 11 on the surface of scale $39Y_2$. In this case, the photodetection position of the scattered light on image sensor 67 changes according to the X-position of foreign substance 11. The photodetection result of image sensor 67 is sent to main controller 20 (refer to FIG. 5). Main controller 20 identifies the position of foreign substance 11 based an the photodetection result.

Incidentally, detection device $PDY_2$ also has a configuration similar to detection device $PDY_1$ described above. Further, detection devices $PDX_1$ to $PDX_4$ have configurations similar to detection devices $PDY_1$ and $PDY_2$ although the irradiation directions of the detection beams of detection devices $PDX_1$ to $PDX_4$ are different from those of detection devices $PDY_1$ and $PDY_2$. Accordingly, the position of foreign substance 11 that exists on the scale ($39X_1$ or $39X_2$) can be detected by using detection devices $PDX_1$ to $PDX_4$. In the embodiment, positional information of wafer stage WST measured by the encoder system described above is used when performing the foreign substance detection, but positional information of wafer stage WST measured by interferometer system 118 may be used instead or in combination.

Incidentally, in the embodiment, because the detection beam from the detection device is irradiated to scales $39X_1$, $39X_2$, $39Y_1$ and $39Y_2$ and reference gratings 52 of CD bar 46, there is the possibility that the diffracted light at the diffraction gratings of scales $39X_1$, $39X_2$, $39Y_1$ and $39Y_2$ and reference gratings 52 of CD bar 46 is received by photodetection system 69S. In the embodiment, however, the grating pitch and the orientation of the diffraction gratings are constant and photodetection system 69B receives the diffracted lights in the same state at all times, and therefore, the detection of the scattered light from foreign substance 11 is hardly affected by the photodetection of the diffracted light. This is because the light quantity (the light intensity) of the received light is increased by the light quantity of the diffracted light from the diffraction gratings, but this increased quantity (the noise component) does not depend on the position while the scattered light from foreign substance 11 differs depending on the position. However, from the viewpoint of improving the S/N ratio of the detection signal of foreign substance, it is preferable to design the placement or the like of photodetection system 69B so that image sensor 67 does not receive the diffracted light.

Moreover, in exposure apparatus 100 of the embodiment, as is shown in FIG. 3, a multipoint focal position detection system (hereinafter, shortly referred to as a "multipoint AF system") based on an oblique incident method is arranged, which is composed of irradiation system 90a and photodetection system 90b, and has a configuration similar to the one disclosed in, for example, Kokai (Japanese Unexamined Patent Application Publication) No. 06-283403 (the corresponding U.S. Pat. No. 5,448,332) and the like. In the embodiment, as an example, irradiation system 90a is placed on the −Y side of the −X end portion of head unit 62C described above and photodetection system 90b is placed on the −Y side of the +X end portion of head unit 62A described above in a state of facing irradiation system 90a.

A plurality of detection points of the multipoint AF system (90a, 90b) are placed at a predetermined distance along the X-axis direction on the surface to be detected. In the embodiment, the plurality of detection points are placed, for example, in the matrix arrangement having one row and M columns (M is a total number of detection points) or having two rows and N colas (N is a half of a total number of detection points). In FIG. 3, the plurality of detection points to which a detection beam is severally irradiated are not individually shown, but are shown as an elongate detection area AF that extends in the X-axis direction between irradiation system 90a and photodetection system 90b. Since the length of detection area AF in the X-axis direction is set to around the same as the diameter of wafer W, positional information (surface position information) in the Z-axis direction of the substantially entire surface of wafer W can be measured by only scanning wafer W in the Y-axis direction once. Further, since detection area AF is placed between liquid immersion area 14 (exposure area IA) described previously and the detection areas of the alignment systems (AL1, AL2$_1$, AL2$_2$, AL2$_3$ and AL2$_4$) in the Y-axis direction, the detection operations of the multipoint AF system and the alignment systems can be performed in parallel. The multipoint AF system may also be arranged at the main frame that holds projection unit PU or the like, but is to be arranged at the measurement frame described earlier in the embodiment.

Incidentally, the plurality of detection points are to be placed in one row and M columns, or two rows and N columns, but the number (s) of rows and/or columns is/are not limited to these numbers. However, in the case where the number of rows is two or more, the positions in the X-axis direction of detection points are preferably made to be different even between the different rows. Moreover, the plurality of detection points are to be placed along the X-axis direction. However, the present invention is not limited to this, and all of or some of the plurality of detection points may also be placed at different positions in the Y-axis direction. For example, the plurality of detection points may also be placed along a direction that intersects both of the X-axis and the Y-axis. That is, the positions of the plurality of detection points only have to be different at least in the X-axis direction. Further, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

Incidentally, although omitted in FIG. 3, in the vicinity of detection points located at both ends out of a plurality of detection points of the multipoint AF system, that is, in the vicinity of both end portions of detection area AF, a pair of Z sensors 72a and 72b and a pair of 72c and 72d described above (refer to FIG. 5) are arranged in the symmetrical placement with respect to straight line LV described above. As the surface position sensors, a sensor that irradiates a light to wafer stage WST from above, receives the reflected light and measures positional information of the wafer stage WST surface in the Z-axis direction orthogonal to the XY plane at an irradiation point of the light, as an example, an optical displacement sensor (a sensor based on an optical pickup method), which has a configuration like an optical pickup used in a CD drive device, is used.

In FIG. 3, a reference sign UP denotes an unloading position where a wafer on wafer stage WST is unloaded, and a reference sign LP denotes a loading position where a wafer is loaded on wafer stage WST. In the embodiment, unloading position UP and loading position LP are set symmetrically with respect to straight line LV. Incidentally, although unloading position UP and loading position LP are separately set as the exchange position of wafer W, unloading position UP and loading position LP may be the same position.

FIG. 5 shows a main configuration of the control system of exposure apparatus 100. The control system is mainly configured of main controller 20 composed of a microcomputer (or a workstation) that performs overall control of the entire apparatus. Incidentally, in FIG. 5, various sensors such as uneven illuminance measuring sensor 94, aerial image measuring instrument 96 and wavefront aberration measuring instrument 98 that are arranged at measurement stage MST are collectively shown as a group of sensors 99.

Figure 6A:
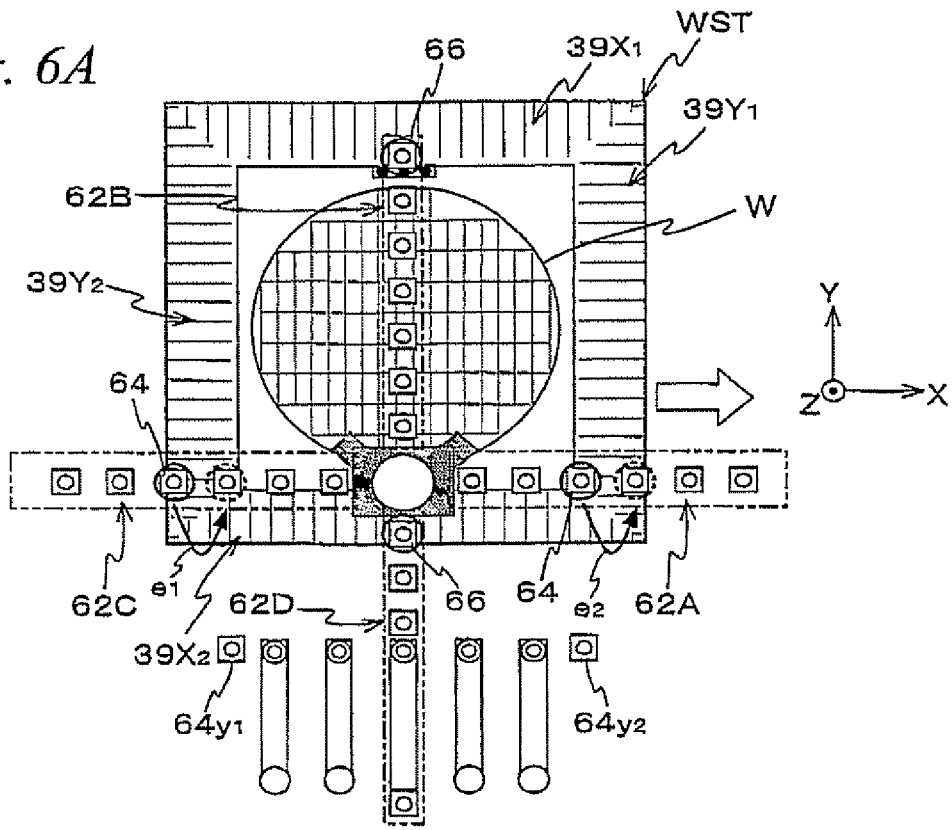
FIGS. 6A and 6B are views used to explain position measurement of a wafer stage within an XY plane by a plurality of encoders each including a plurality of heads placed in the array arrangement, and carryover of measurement values between the heads.
Figure 6B:
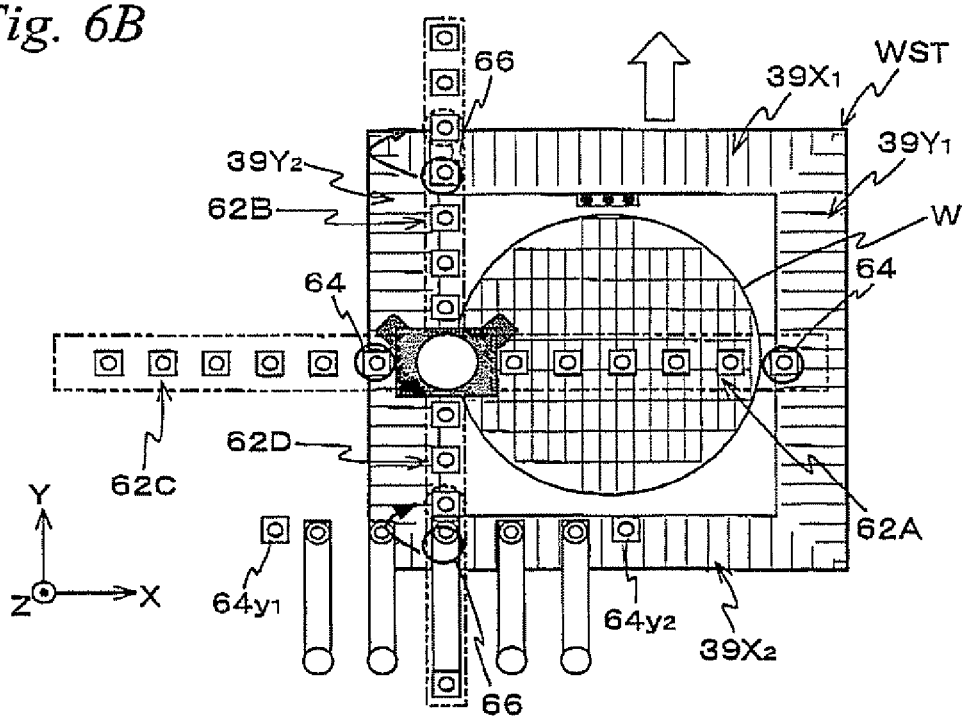

In exposure apparatus 100 of the embodiment having the configuration described above, since the placement of the X scales and Y scales on wafer stage WST as described above and the placement of the X heads and Y heads as described above are employed, X scale 39X$_1$ and 39X$_2$ respectively face head units 62B and 62D (X heads 66) and also Y scales 39Y$_1$ and 39Y$_2$ respectively face head units 62A and 62C (Y heads 64) or Y heads 64y$_1$ and 64y$_2$ without fail in an effective stroke range of wafer stage WST (i.e. a range in which wafer stage WST moves for the alignment and the exposure operation, in the embodiment), as is exemplified in the drawings such as FIGS. 6A and 6B. Incidentally, in FIGS. 6A and 6B, the heads that face the corresponding X scales or Y scales are indicated by being circled.

Therefore, in the effective stroke range of wafer stage WST described above, main controller 20 can control positional information (including rotational information in the θz direction) of wafer stage WST within the XY plane with high precision by controlling each motor constituting stage drive system 124, based on measurement values of at least three encoders of encoders 70A to 70D, or at least three encoders of encoders 70E$_1$, 70F$_1$, 70B and 70D. Since the influence of air fluctuations that the measurement values of encoders 70A to 70F receive is small enough to be ignored when comparing with the interferometer, the short-term stability of the measurement values that is affected by air fluctuations is remarkably better than that of the interferometer. Incidentally, in the embodiment, the size (e.g. the number of the heads and/or the distance between the heads) of head units 62B, 62D, 62A and 62C is set in accordance with the effective stroke range of water stage WST and the size of the scales (i.e. the formation range of the diffraction gratings), or the like. Accordingly, in the effective stroke range of wafer stage WST, all of four scales 39X$_1$, 39X$_2$, 39Y$_1$ and 39Y$_2$ face head units 62B, 62D, 62A and 62C respectively, but all the four scales do not have to face the corresponding head units. For example, one of X scales 39X$_1$ and 39X$_2$ and/or one of Y scales 39Y$_1$ and 39Y$_2$ do not have to face the head unit. In the case where one of X scales 39X$_1$ and 39X$_2$ or one of Y scales 39Y$_1$ and 39Y$_2$ does not face the head unit, three scales face the head units in the effective stroke range of wafer stage WST, and therefore positional information of wafer stage WST in the X-axis direction, the Y-axis direction and the θz direction can be constantly measured. Further, in the case where one of X scales 39X$_1$ and 39X$_2$ and one of Y scales 39Y$_1$ and 39Y$_2$ do not face the head units, two scales face the head units in the effective stroke range of wafer stage WST, and therefore positional information of wafer stage WST in the θz direction cannot be constantly measured, but positional information of wafer stage WST in the X-axis direction and the Y-axis direction can be constantly measured. In this case, position control of wafer stage WST may also be performed by using positional information of wafer stage WST in the θz direction measured by interferometer system 118 in combination.

Further, when wafer stage WST is driven in the X-axis direction as indicated by an outline arrow in FIG. 6A, Y head 64 that measures the position in the Y-axis direction of wafer stage WST is sequentially switched to adjacent Y head 64 as indicated by arrows $e_1$ and $e_2$ in the drawing. For example, Y head 64 circled by a solid line is switched to Y head 64 circled by a dotted line. Therefore, the measurement values are carried over before and after the switching. That is, in the embodiment, in order to perform the switching of Y heads 64 and the carryover of the measurement values smoothly, a distance between adjacent Y heads 64 that are equipped in head units 62A and 62C is set shorter than a width of Y scales 39$Y_1$ and 39$Y_2$ in the X-axis direction, as is described previously.

Further, although omitted in the drawing, the switching (the linkage process) between adjacent Z sensors 76 and between adjacent Z sensors 74, which are equipped in head units 62A and 62C respectively, is performed in the similar manner to the case of the Y heads described above.

Further, in the embodiment, since a distance between adjacent X heads 66 that axe equipped in head units 62B and 62D is set shorter than a width of X scales 39$X_1$ and 39$X_2$ in the Y-axis direction as is described previously, when wafer stage WST is driven in the Y-axis direction as indicated by an outline arrow in FIG. 63, similarly to the case described above, X head 66 that measures the position in the X-axis direction of wafer stage WST is sequentially switched to adjacent X head 66 (e.g. X head 66 circled by a solid line is switched to X head 66 circled by a dotted line), and the measurement values are carried over before and after the switching.

Next, configurations and the like of encoders 70A to 70F will be described, focusing on Y encoder 70A that is enlargedly shown in FIG. 7A, as a representative. FIG. 7A shows one Y head 64 of head unit 62A that irradiates a detection light (a measurement beam) to Y scale 39$Y_1$.

Y head 64 is mainly configured of three sections, which are an irradiation system 64$a$, an optical system 64$b$ and a photodetection system 64$c$.

Irradiation system 64$a$ includes a light source that emits a laser beam LB in a direction inclined at an angel of 45 degrees with respect to the Y-axis and Z-axis, for example, a semiconductor laser LD, and a lens L1 that is placed in the optical path of laser beam LB emitted from semiconductor laser LD.

Optical system 64$b$ is equipped with a polarization beam splitter PBS whose separation plane is parallel to an XZ plane, a pair of reflection mirrors: R1$a$ and R1$b$, lenses L2$a$ and L2$b$, quarter wavelength plates (hereinafter, referred to as λ/4 plates) WP1$a$ and WP1$b$, reflection mirrors R2$a$ and R2$b$, and the like.

Photodetection system 64$c$ includes a polarizer (an analyzer), a photodetector, and the like.

In Y encoder 70A, laser beam LB emitted from semiconductor laser LD is incident on polarization bean splitter PBS via lens L1, and is split by polarization into two beams $LB_1$ and $LB_2$. Beam $LB_1$ having been transmitted through polarization beam splitter PBS reaches reflective diffraction grating RG that is formed on Y scale 39$Y_1$, via reflection mirror R1$a$, and beam $LB_2$ reflected off polarization beam splitter PBS reaches reflective diffraction grating RG via reflection mirror R1$b$. Incidentally, "split by polarization" in this case means the splitting of an incident beam into a P-polarization component and an S-polarization component.

Predetermined-order diffracted beams that are generated from diffraction grating RG due to irradiation of beams $LB_1$ and $LB_2$, for example, the first-order diffracted beams are severally converted into a circular polarized light by λ/4 plates WP1$b$ and WP1$a$ via lenses L2$b$ and L2$a$, and reflected by reflection mirrors R2$b$ and R2$a$ and then the beams pass through λ/4 plates WP1$b$ and WP1$a$ again and reach polarization beam splitter PBS by tracing the same optical path in the reversed direction.

Each of the polarization directions of the two beams that have reached polarization beam splitter PBS is rotated at an angle of 90 degrees with respect to the original direction. Therefore, the first-order diffracted beam of beam $LB_1$ that was previously transmitted through polarization beam splitter PBS is reflected off polarization beam splitter PBS and is incident on photodetection system 64$c$, and also the first-order diffracted beam of beam $LB_2$ that was previously reflected off polarization beam splitter PBS is transmitted through polarization beam splitter PBS and is synthesized concentrically with the first-order diffracted beam of beam $LB_1$ and is incident on photodetection system 64$c$.

Then, the polarization directions of the two first-order diffracted beams described above are uniformly arranged by the analyzer inside photodetection system 64$c$ and the beams interfere with each other to be an interference light, and the interference light is detected by the photodetector and is converted into an electric signal in accordance with the intensity of the interference light.

Figure 7B:
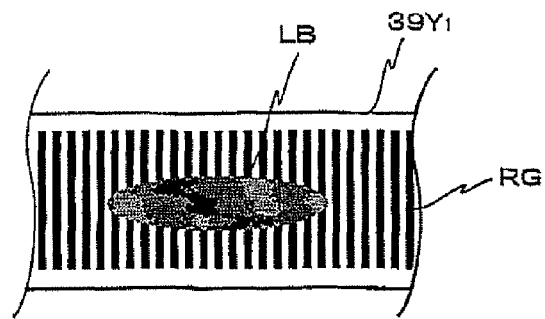
FIG. 7B is a view showing the case where a laser beam LB having a sectional shape that is elongated in a periodic direction of a grating RG is used as a detection light.

As is obvious from the above description, in Y encoder 70A, since the optical path lengths of two beams to be interfered are extremely short and also are almost equal to each other, the influence by air fluctuations can mostly be ignored. Then, when Y scale 39$Y_1$ (i.e. wafer stage WST) moves in the measurement direction (the Y-axis direction, in this case), the phase of each of the two beams changes and thus the intensity of the interference light changes. This change in the intensity of the interference light is detected by photodetection system 64$c$, and positional information in accordance with the intensity change is output as the measurement value of Y encoder 70A. Other encoders 70B, 70C, 70D and the like are also configured similar to encoder 70A. As each of the encoders, for example, an encoder having a resolution around 0.1 nm is used. Incidentally, as is shown in FIG. 7B, in the encoders of the embodiment, laser beam LB having a sectional shape that is elongated in the periodic direction of diffraction grating RG composed of the grating lines may also be used as a detection light. In FIG. 7B, beam LB is shown exaggeratingly larger, compared to the grating lines of diffraction grating RG.

Next, a parallel processing operation using wafer stage WST and measurement stage MST in exposure apparatus 100 of the embodiment will be described, referring to FIGS. 8 to 21. Incidentally, during the operation described below, main controller 20 performs opening/closing control of each valve of liquid supply device 5 and liquid recovery device 6 of local liquid immersion device 8 as is described earlier, and the space on the outgoing surface side of tip lens 191 of projection optical system PL is constantly filled with water. However, description regarding control of liquid supply device 5 and liquid recovery device 6 will be omitted in the following description, in order to make the description easily understandable. Further, the following description regarding the operation will be made using many drawings, but the reference signs of the same members are shown in some drawings and not shown in the other drawings. That is, the reference signs shown are different in each of the drawings, but these drawings show the same configuration regardless of existence or non-existence of the reference signs. The same is true also in each of the drawings used in the description above.

Incidentally, as a premise, baseline measurement (baseline check) of primary alignment system AL1 and baseline measurement operations of secondary alignment system $AL2_n$ (n=1 to 4) are assumed to have been already performed. Herein, the baseline of primary alignment system AL1 means the positional relation (or the distance) between the projection position of a pattern (e.g. a pattern of reticle R) by projection optical system PL and the detection center of primary alignment system AL1, and the baseline of secondary alignment system $AL2_n$ means the relative position of (the detection center of) each secondary alignment system $AL2_n$ with reference to (the detection center of) primary alignment system AL1. For example, fiducial mark FM is measured in a state where the position of fiducial mark FM is set within the Filed (the detection area) of primary alignment system AL1, and also aerial images of a pair of measurement marks are measured respectively in a state where the position of fiducial mark FM is set within exposure area IA (liquid immersion area 14) of projection optical system PL, in an aerial image measurement operation based on a slit-scan method using a pair of aerial image measurement slit patterns SL similarly to the method disclosed in, for example, Kokai (Japanese Unexamined Patent Application Publication) No. 2002-014005 (the corresponding U.S. Patent Application Publication No. 2002/0041377) and the like, and based on the respective detection results and measurement results, the baseline of primary alignment system AL1 is computed. Further, for example, a specific alignment mark on wafer W (a process wafer) at the head of a lot is detected beforehand by each of primary alignment system AL1 and secondary alignment systems-$AL2_1$ to $AL2_4$, and the baseline of secondary alignment system $AL2_n$ is computed from the detection results and the measurement values of encoders 70A to 70D at the time of the detection. Incidentally, main controller 20 adjusts the position in the X-axis direction of secondary alignment systems $AL2_1$ to $AL2_4$ beforehand in conformity with the placement of alignment shot areas.

Figure 8:
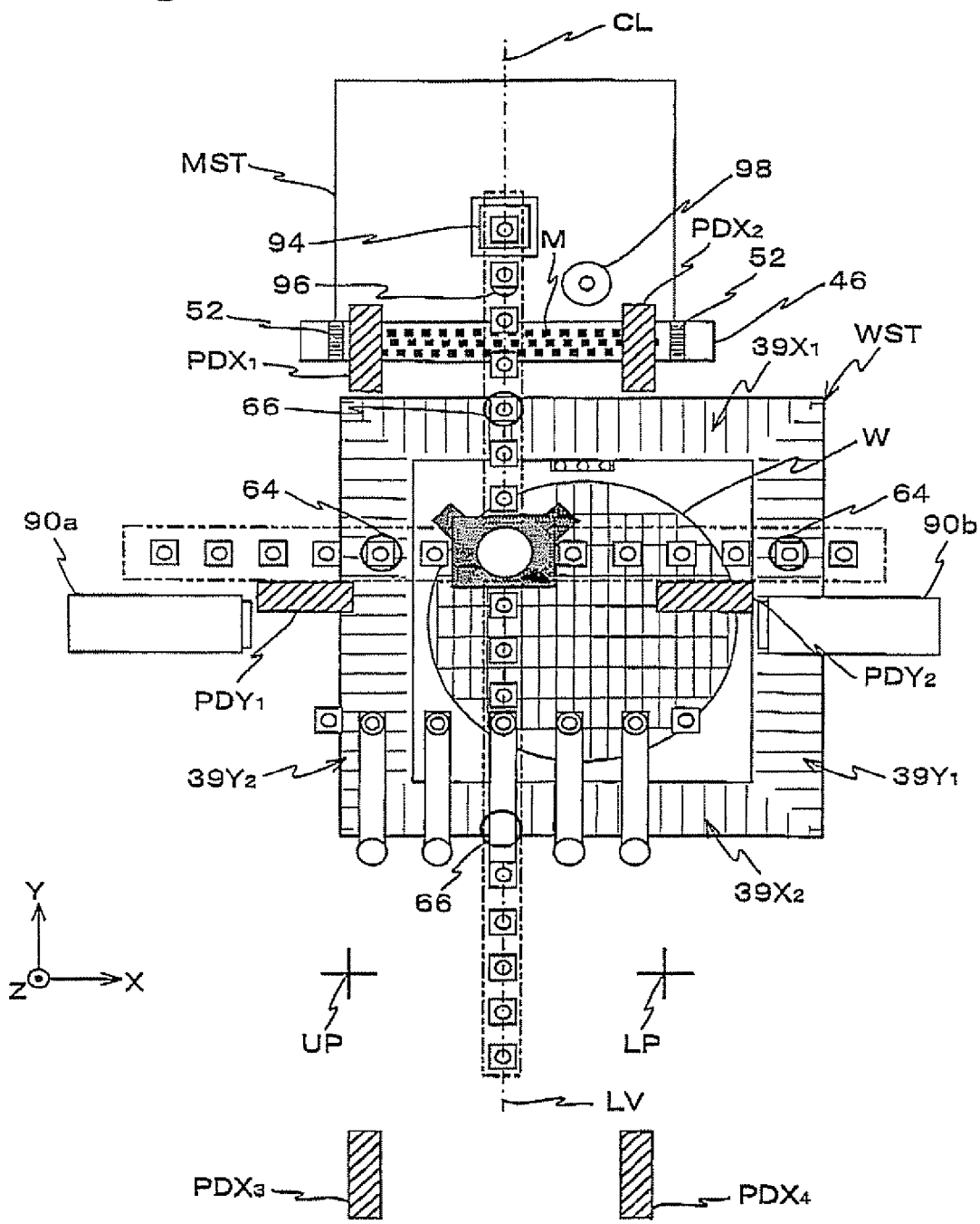
FIG. 8 is a view showing a state of the wafer stage and a measurement stage when exposure based on a step-and-scan method is being performed to a wafer on the wafer stage.

FIG. 8 shows a state where exposure based on a step-and-scan method is being performed to wafer W (in this case, to be a mid water of a certain lot (one lot containing 25 or 50 wafers), as an example) on wafer stage WST. During the exposure, main controller 20 controls the position within the XY plane (including the θz rotation) of wafer stage WST, based on the measurement values of at least three encoders out of two X heads 66 (X encoders 70B and 70D) indicated by being circled in FIG. 8 that face X scales $39X_1$ and $39X_2$ respectively and two Y heads 64 (Y encoders 70A and 70C) indicated by being circled in FIG. 8 that face Y scales $39Y_1$ and $39Y_2$ respectively. Further, main controller 20 controls the position in the Z-axis direction, and the θy rotation (rolling) and the ƒx rotation (pitching) of wafer stage WST, based on the measurement values of Z sensors $74_i$ and $76_j$ ("i" and "j" are either of 1 to 6) described above arranged inside head units 62A and 62C, and controls the θx rotation (pitching) based on the measurement values of Y-axis interferometer 16.

Incidentally, the Z sensors are placed also in the Y-axis direction inside or in the vicinity of head units 62A and 62C, and the position in the Z-axis direction, the θy rotation (rolling) and the θx rotation (pitching) of wafer stage WST may be controlled based on the measurement values of a plurality of the Z sensors. In either case, the control of the position in the Z-axis direction, the θy rotation and the θx rotation of wafer stage WST (focus leveling control of wafer W) during the exposure is performed based on the results of the focus mapping (to be described later) that was performed beforehand.

The foregoing exposure operation is performed by main controller 20 repeating an inter-shot moving operation in which wafer stage WST is moved to a scanning starting position (accelerating starting position) for exposure of each shot area on wafer W based on the result of wafer alignment performed beforehand, for example, Enhanced Global Alignment (EGA which will be described later), the latest baselines of alignment systems AL1 and $AL2_1$ to $AL2_4$, and the like, and a scanning exposure operation in which a pattern formed on reticle R is transferred to each shot area by a scanning exposure method. Incidentally, the exposure operation described above is performed in a state where water is held in the space between tip lens 191 and wafer W. Further, the exposure operation is performed in the order from the shot area located on the −Y side to the shot area located on the +Y side in FIG. 8. Moreover, as is disclosed in, for example, Kokai (Japanese Unexamined Patent Application Publication) No. 61-044429 (the corresponding U.S. Pat. No. 4,780, 617), in the EGA method, some (e.g. around 8 to 16) of a plurality of shot areas on wafer W are selected as alignment shot areas, and alignment marks on the selected shot areas are detected by alignment system $AL_1$ and $AL2_1$ to $AL2_4$. Then, by performing statistical computation of positional information of the alignment marks that has been detected, positional information (alignment coordinate) of each shot areas on wafer W is computed. In this EGA method, not only the positional information of shot areas but also information on the scaling and the rotation of wafer W or the like can be obtained.

Figure 9:
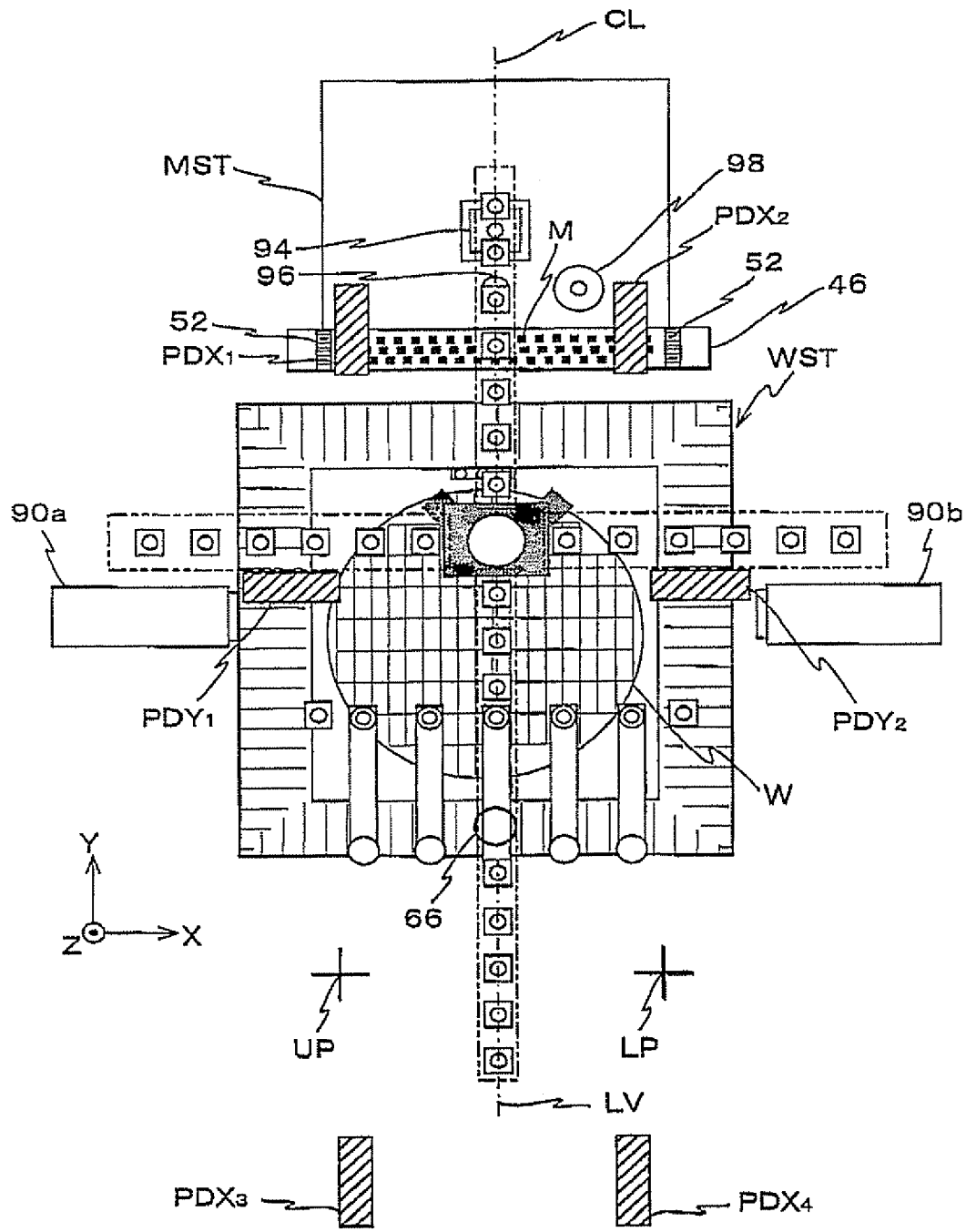
FIG. 9 is a view showing a state of the wafer stage and the measurement stage when exposure to the wafer ends on the side of the wafer stage.
Figure 10:
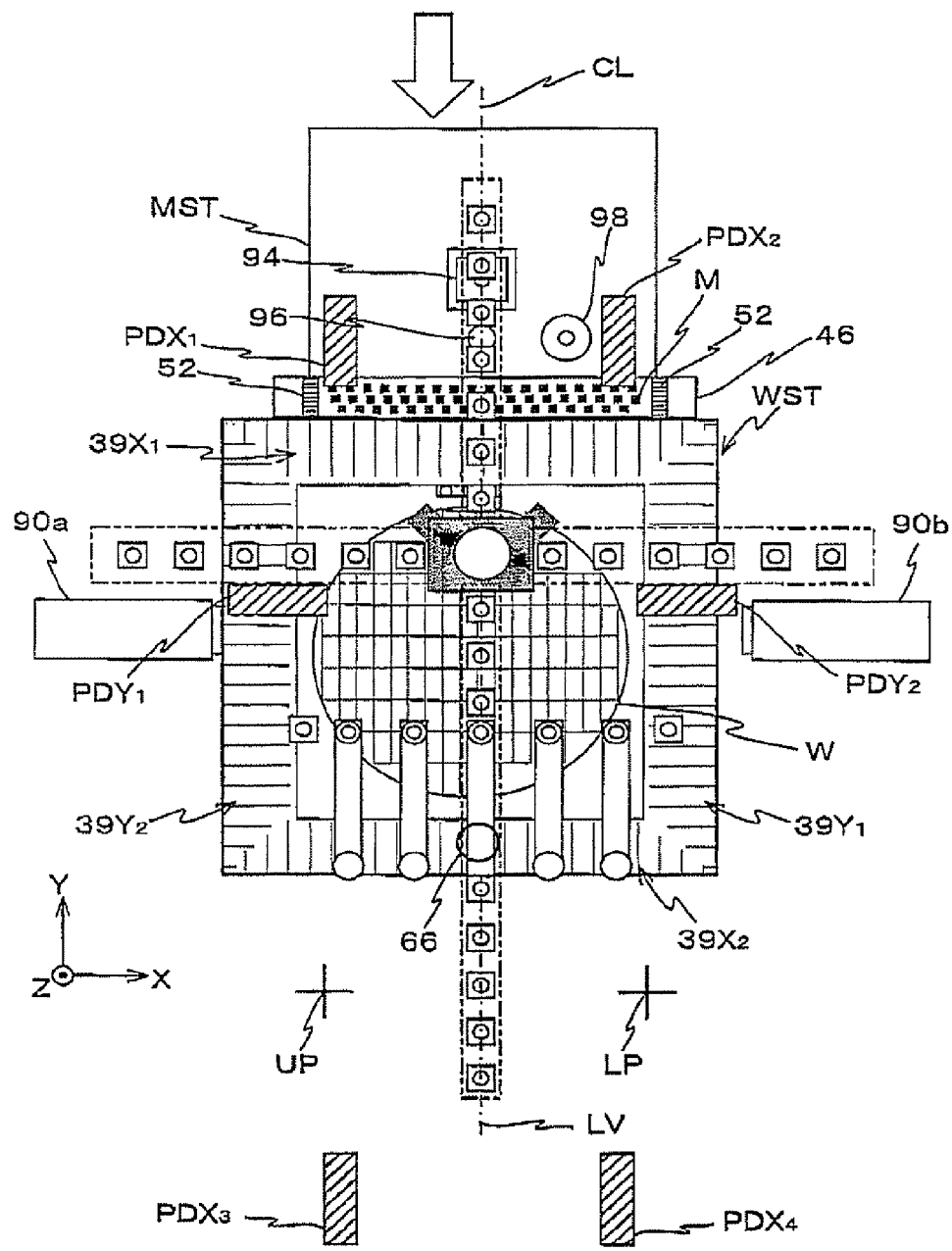
FIG. 10 is a view showing a state of the wafer stage and the measurement stage immediately after the state of both stages goes from a state of separation to a state of coming into contact with each other.

Then, as is shown in FIG. 9, before exposure to wafer W ends (the last shot area is exposed), main controller 20 moves measurement stage MST to the position shown in FIG. 10 by controlling stage drive system 124 based on the measurement value of Y-axis interferometer 11 while maintaining the measurement value of X-axis interferometer 130 to a constant value. On this operation, the end surface on the −Y side of CD bar 46 and the end surface on the +Y side of wafer stage WST are in contact with each other. Incidentally, the noncontact state (the proximity state) may also be kept by, for example, monitoring the measurement values of the interferometer or the encoder that measures the position of each stage in the Y-axis direction and separating measurement stage MST and wafer stage WST in the Y-axis direction at a distance of around 300 μm.

Figure 11:
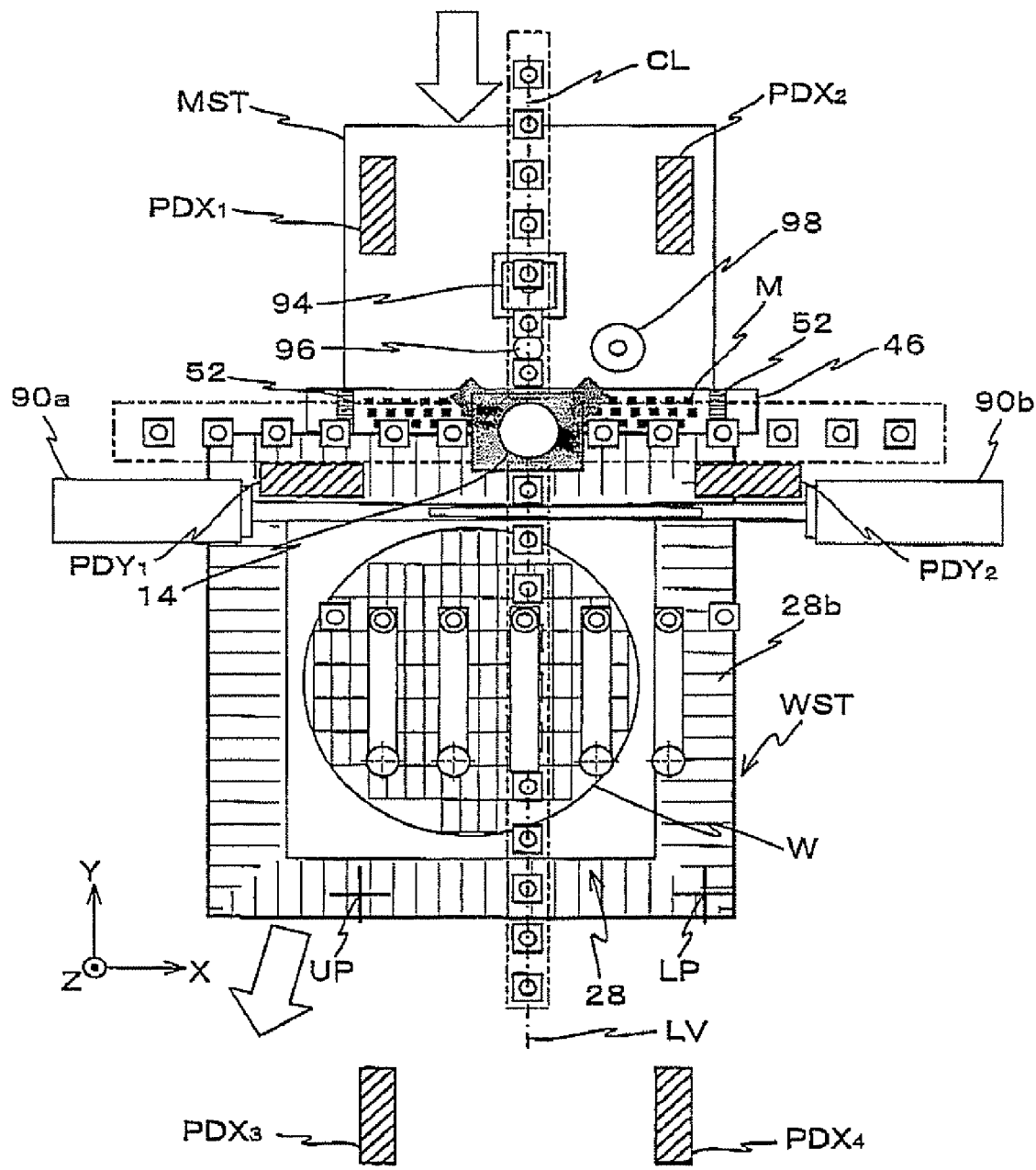
FIG. 11 is a view showing a state of the wafer stage and the measurement stage when the measurement stage moves to a −Y direction and the wafer stage moves toward an unloading position while keeping the positional relation between both stages in a Y-axis direction.

Subsequently, as is shown in FIG. 11, while keeping the positional relation in the Y-axis direction between wafer stage WST and measurement stage MST, main controller 20 starts an operation of driving measurement stage MST to the −Y direction and also starts an operation of driving wafer stage WST toward unloading position UP. When these operations are started, in the embodiment, measurement stage MST is moved only to the −Y direction, and wafer stage WST is moved to the −Y direction and −X direction.

When main controller 20 drives wafer stage WST and measurement stage MST simultaneously as is described above, water that is held in the space between tip lens 191 of projection unit PU and wafer W (water in liquid immersion area 14) sequentially moves from wafer W to plate 28, CD bar 46, and measurement stage MST, according to movement of wafer stage WST and measurement stage MST to the −Y side. Incidentally, during the foregoing movement, the contact state (or proximity state) of wafer stage WST and measurement stage MST is maintained. Incidentally, FIG. 11 shows a state right before water in liquid immersion area 14 is delivered from plate 28 to CD bar 46.

Figure 12:
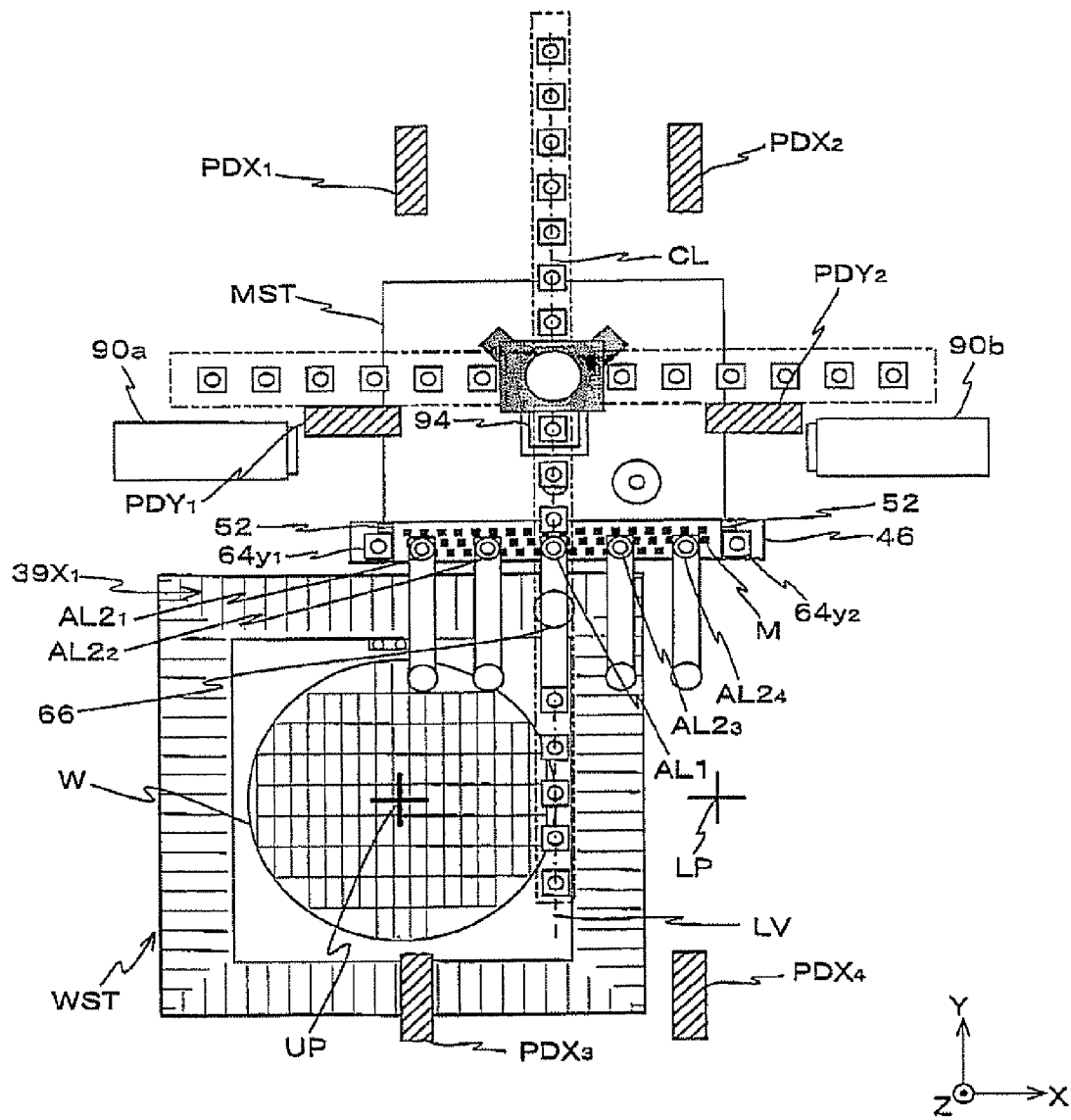
FIG. 12 is a view showing a state of the wafer stage and the measurement stage when the measurement stage reaches a position where Sec-BCHK (interval) is performed.

When wafer stage WST and measurement stage MST are simultaneously and slightly driven further to the −Y direction from the state of FIG. 11, position measurement of wafer stage WST by Y encoders 70A and 70C cannot be performed. Therefore, right before that, main controller 20 switches the control of the Y-position and the θz rotation of wafer stage WST from the control based on the measurement values of Y encoders 70A and 70C to the control based on the measurement values of Y-axis interferometer 16. Then, after a predetermined period of time, as is shown in FIG. 12, since CD bar 46 of measurement stage MST is positioned right below alignment systems AL1 and AL2$_1$ to AL2$_4$, main controller 20 stops measurement stage MST at this position, and also drives further wafer stage WST toward unloading position UP while measuring the X-position of wafer stage WST by X head 66 indicated by being circled in FIG. 12 that faces X scale 39X$_1$ (X-linear encoder 703B) and measuring the Y-position, the θz rotation and the like by Y-axis interferometer 16, and stops wafer stage WST at unloading position UP. Incidentally, in the state of FIG. 12, water is held in the space between measurement stage MST and tip lens 191.

Figure 13:
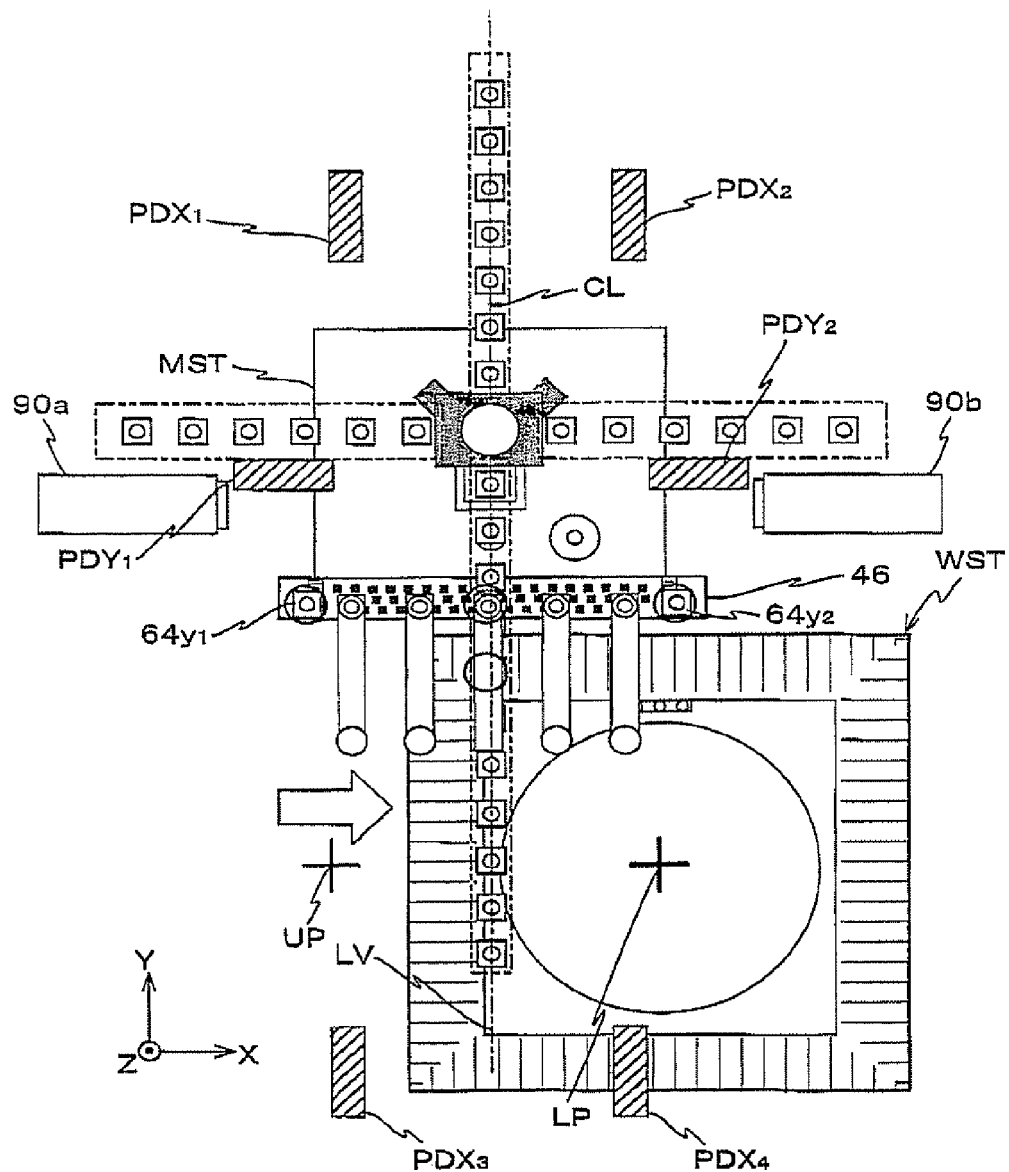
FIG. 13 is a view showing a state of the wafer stage and the measurement stage when the wafer stage moves from the unloading position to a loading position in parallel with the Sec-BCHK (interval) being performed.

Subsequently, as is shown in FIGS. 12 and 13, main controller 20 measures the relative positional relation (the baseline) of (the detection center of) secondary alignment system AL2n with reference to (the detection center of) primary alignment system AL$_1$, using reference marks M of CD bar 46. The baseline measurement in this case is performed at intervals of each wafer exchange, and thus hereinafter the baseline measurement is also described as "Sec-BCHK (interval)".

In this Sec-BCHK (interval), main controller 20 adjusts the θz rotation of CD bar 46 based on the measurement values of Y heads 64y$_1$ and 64y$_2$ that face a pair of reference gratings 52 on CD bar 46 respectively (Y-axis linear encoders 70E$_2$ and 70F$_2$), and also adjusts the XY-position of CD bar 46 using, for example, the measurement value of the interferometer, based on the measurement value of primary alignment system AL1 that detects reference mark M that is located on centerline CL of measurement stage MST or in the vicinity thereof.

Then, in this state, main controller 20 obtains each of the baselines of four secondary alignment systems AL2$_1$ to AL2$_4$ by simultaneously measuring reference marks M on CD bar 46 within the fields of the respective secondary alignment systems using four secondary alignment systems AL2$_1$ to AL2$_4$. And, when performing the subsequent process, drift of the baselines of four secondary alignment systems AL2$_1$ to AL2$_4$ are corrected by using the newly measured baselines.

Further, in parallel with the Sec-BCHK (interval), main controller 20 gives the command and makes a drive system of an unload arm (not shown) unload wafer W on wafer stage WST that stops at unloading position UP, and also drives wafer stage WST to the +X direction to move it to loading position LP.

Figure 14:
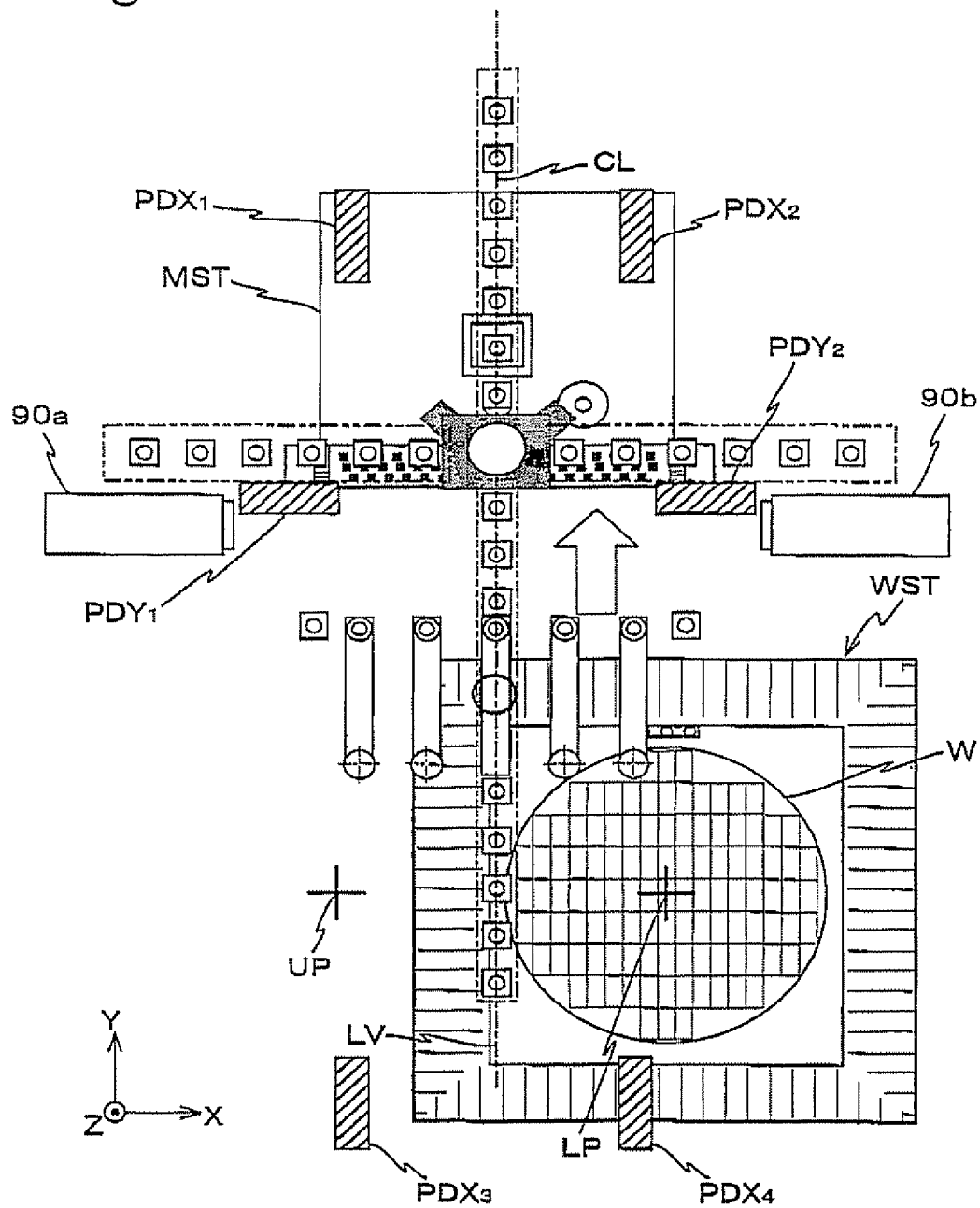
FIG. 14 is a view showing a state of the wafer stage and the measurement stage when the measurement stage moves to an optimal scrum waiting position and a wafer is loaded on the wafer stage.

Next, as is shown in FIG. 14, main controller 20 moves measurement stage MST to an optimal waiting position (hereinafter, referred to as an "optimal scrum waiting position") used to shift a state of measurement stage MST from a state of being away from wafer stage WST to the contact state (or proximity state) with wafer stage WST described previously. In parallel with this operation, main controller 20 gives the command and makes a drive system of a load arm (not shown) load new wafer W onto wafer stage WST. Incidentally, FIG. 14 shows a state where wafer W is loaded on wafer stage WST.

In the embodiment, the above-described optimal scrum waiting position of measurement stage MST is appropriately set in accordance with the Y-coordinates of the alignment marks arranged in the alignment shot areas on the wafer. With this setting, an operation of moving measurement stage MST to the optimal scrum waiting position that is needed on the sift to the contact state (or proximity state) described above becomes unnecessary, and therefore the number of movement of measurement stage MST can be reduced by one, compared with the case where measurement stage MST is made to wait at a position away from the optimal scrum waiting position. Further, in the embodiment, the optimal scrum waiting position is determined so that the shift to the contact state (or proximity state) described above can be performed at a position where wafer stage WST stops for the wafer alignment described earlier.

Figure 15:
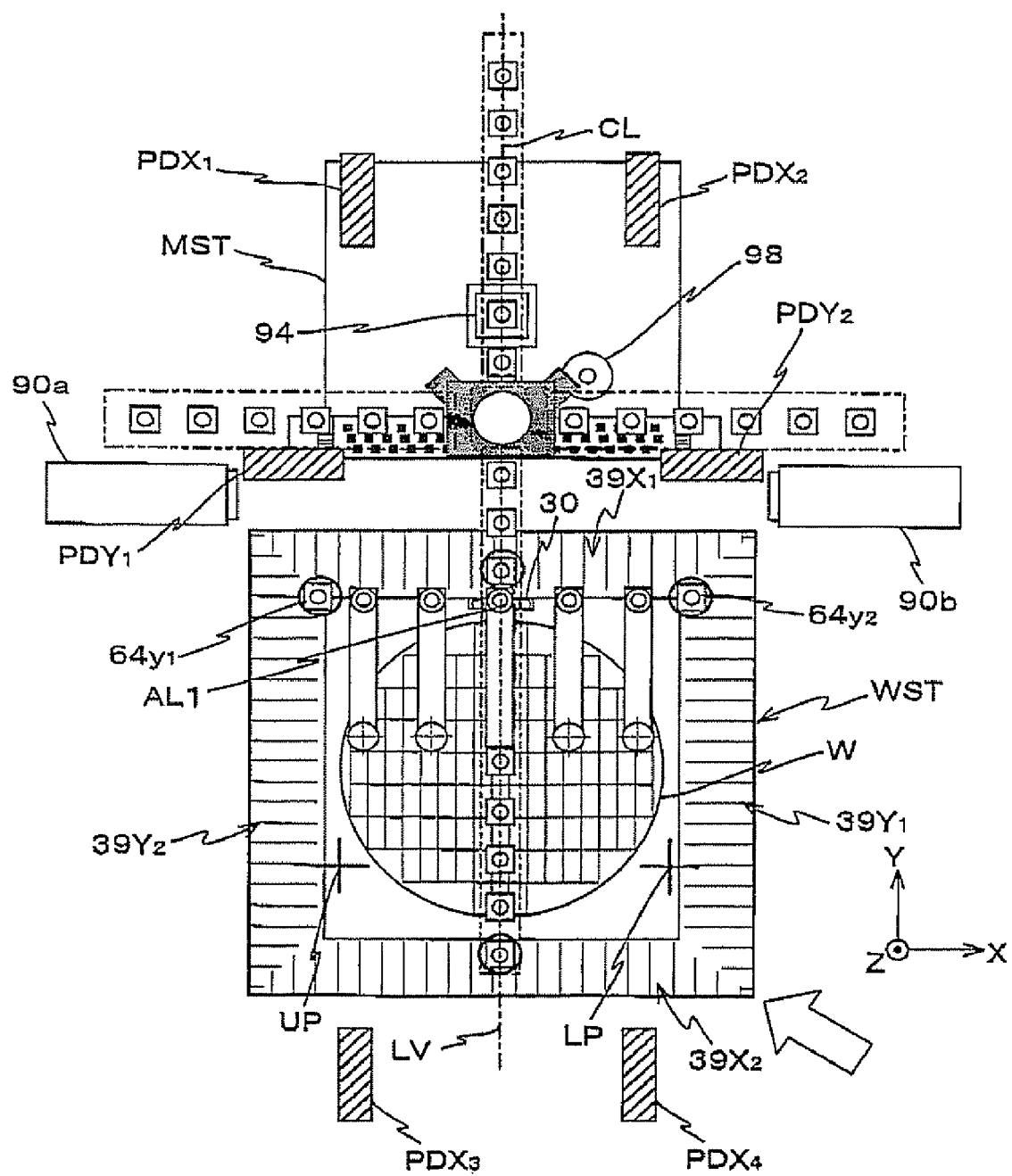
FIG. 15 is a view showing a state of the wafer stage and the measurement stage when the wafer stage moves to a position where the former process of Pri-BCHK is performed while the measurement stage is waiting at the optimal serum waiting position.

Next, main controller 20 moves wafer stage WST to the position shown in FIG. 15. In the middle of the movement, main controller 20 swatches control of the position of wafer stage WST within the XY plane from the control based on the measurement value of encoder 70B regarding the X-axis direction and the measurement value of Y-axis interferometer 16 regarding the Y-axis direction and the θz rotation, to the control based on the measurement values of three encoders, which are either of two X heads 66 indicated by being circled in FIG. 15 that face X scales 39X$_1$ and 39X$_2$ (encoder 70D) and two Y heads 64y$_2$ and 64y$_1$ indicated by being circled in FIG. 15 that face Y scales 39Y$_1$ and 39Y$_2$ (encoders 70F$_1$ and 70E$_1$).

Next, main controller 20 starts movement of wafer stage WST to the +Y direction, while controlling the position of wafer stage WST based on the measurement values of the three encoders described above. Then, when wafer stage WST reaches the position shown in FIG. 16, main controller 20 makes wafer stage WST and measurement stage MST come into contact with each other (or be close to each other at a distance of around 300 μm), and immediately stops wafer stage WST.

After the stop of wafer stage WST, main controller 20 almost simultaneously and individually detects the alignment marks (refer to star-shaped marks in FIG. 16) arranged in three shot areas (hereinafter, referred to as "first alignment shot areas") using primary alignment system AL1 and secondary alignment systems AL2$_2$ and AL2$_3$, and links the detection results of three alignment systems AL1, AL2$_2$ and AL2$_3$ and the measurement values of the three encoders described above at the time of the detection and stores them in a memory (not shown). Incidentally, the simultaneous detection of the alignment marks arranged in the three first alignment shot areas in this case is performed while changing the relative positional relation in the Z-axis direction (the focus direction) between a plurality of alignment systems AL1 and AL2$_1$ to AL2$_4$ and wafer W mounted on wafer stage WST by changing the Z-position of wafer stage WST.

Figure 16:
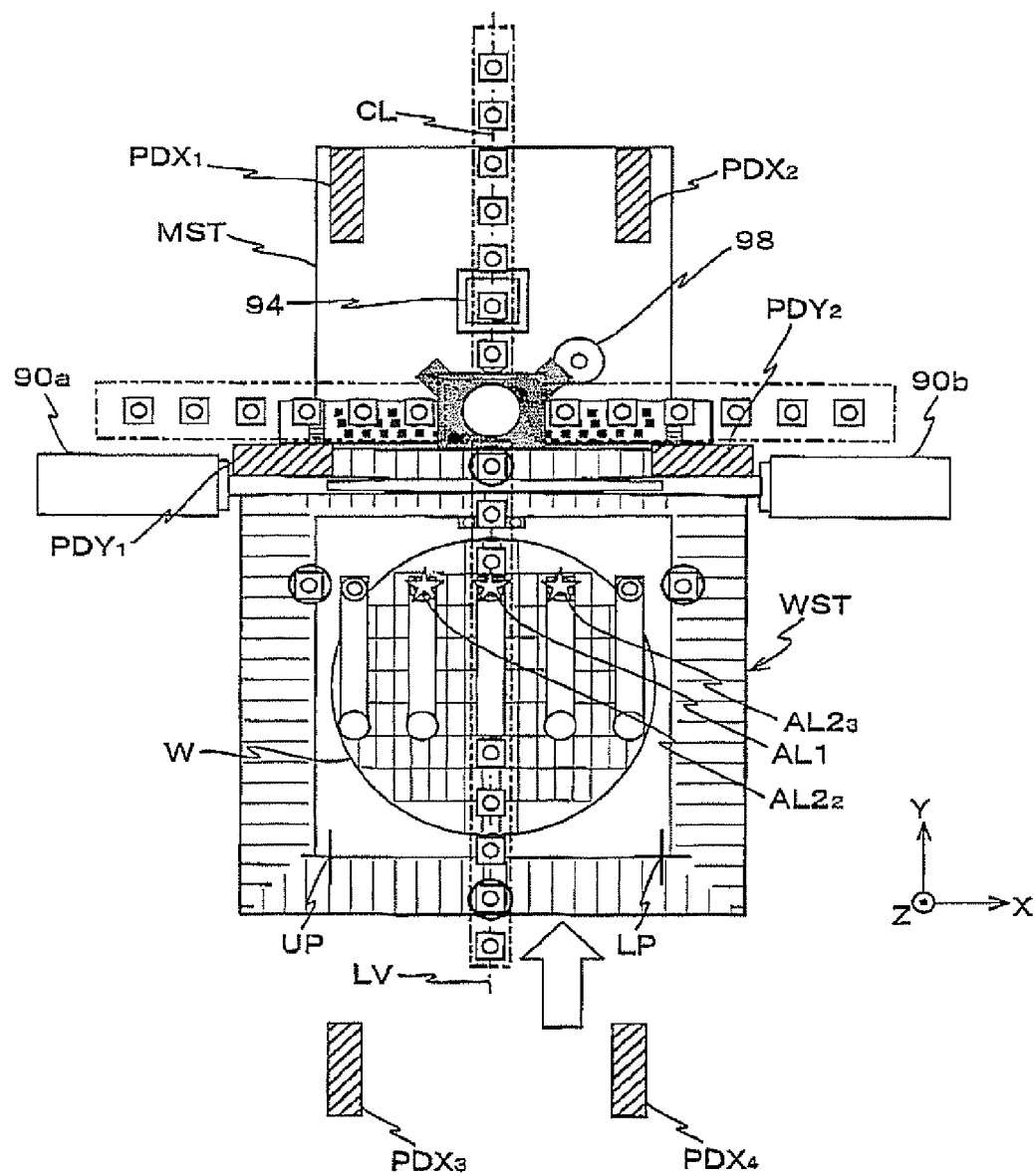
FIG. 16 is a view showing a state of the wafer stage and the measurement stage when alignment marks arranged in three first alignment shot areas are simultaneously being detected using alignment system AL1, $AL2_2$ and $AL2_3$.

As is described above, in the embodiment, the shift to the contact state (or proximity state) of measurement stage MST and wafer stage WST is completed at the position where detection of the alignment marks in the first alignment shot areas is performed, and from the position, the movement to the +Y direction of both stages WST and MST in the contact state (or proximity state) is started by main controller 20. Prior to the start of the movement to the +Y direction of both stages WST and MST, as is shown in FIG. 16, main controller 20 starts irradiation of detection beams from the multipoint AF system (90a, 90b) to wafer stage WST. With this operation, the detection area of the multipoint AF system is formed on wafer stage WST.

On this operation, liquid immersion area 14 is formed near the boundary between CD bar 46 and wafer stage WST. That is, water in liquid immersion area 14 is in a state just before being delivered from CD bar 46 to wafer stage WST.

Figure 17:
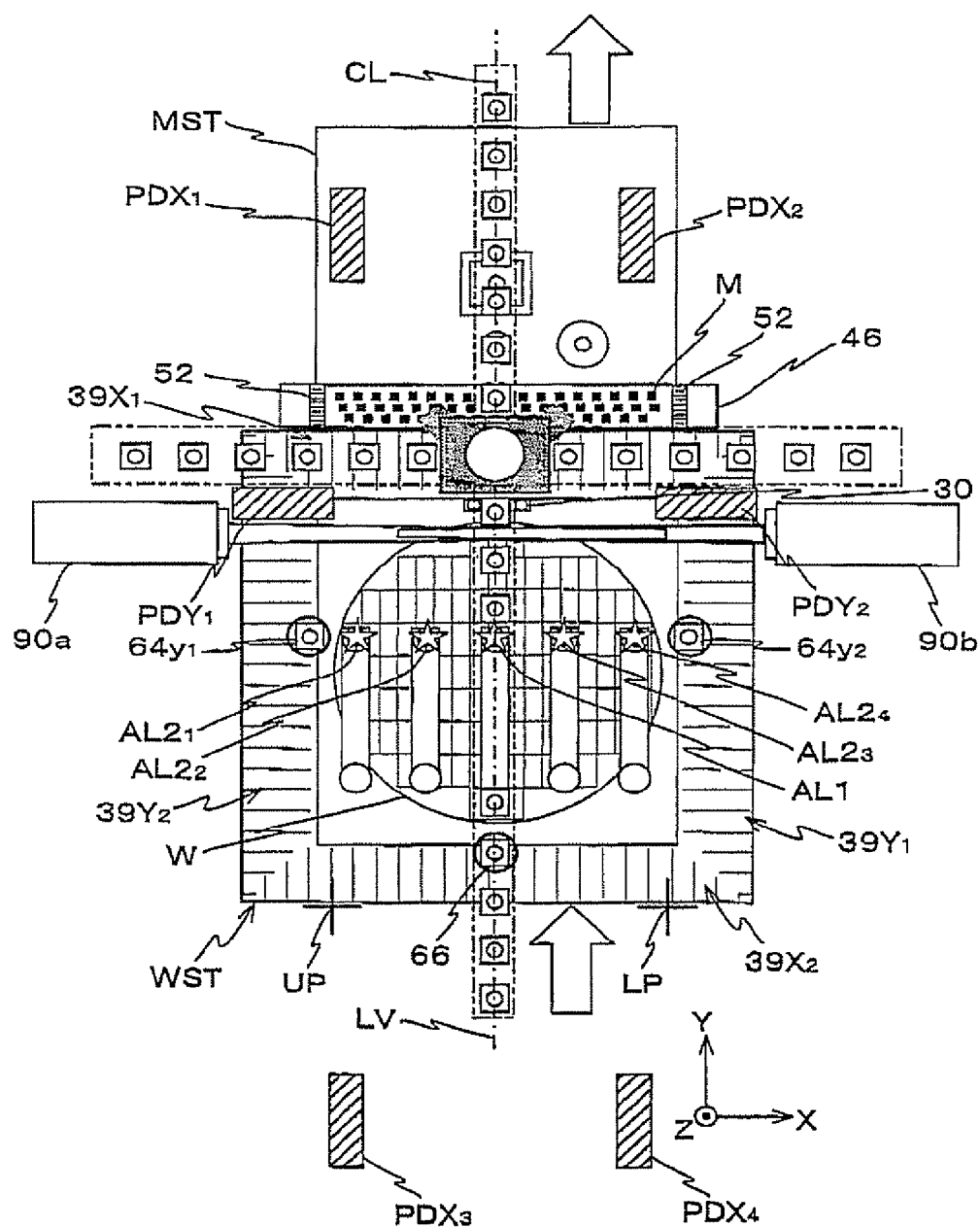
FIG. 17 is a view showing a state of the wafer stage and the measurement stage when alignment marks arranged in five second alignment shot areas are simultaneously being detected using alignment system AL1, and $AL2_1$ to $AL2_4$.

Then, when both stages WST and MST further move to the +Y direction while keeping their contact state (or proximity state) and reach the position shown in FIG. 17, main controller 20 almost simultaneously and individually detects the alignment marks (refer to star-shaped marks in FIG. 17) arranged in five shot areas (hereinafter, referred to as "second alignment shot areas") located at positions that face alignment systems AL1 and AL2$_1$ to AL2$_4$ respectively in FIG. 17, using five alignment systems AL1 and AL2$_1$ to AL2$_4$, and links the detection results of five alignment systems AL1 and AL2$_1$ to AL2$_4$ and the measurement values of the three encoders described above at the time of the detection, and then stores them in the memory (not shown). Incidentally, the simultaneous detection of the alignment marks arranged in the five second alignment shot areas in this case is also performed while changing the Z-position of wafer stage WST, similar to the detection of the first alignment shot areas.

When performing this operation, because the X head that faces X scale 39X$_1$ and is also located on straight line LV described above does not exist, main controller 20 controls the position of wafer stage WST within the XY plane based on the measurement values of X head 66 that faces X scale 39X$_2$ (X linear encoder 70D) and Y linear encoders 70E$_1$ and 70F$_1$.

As is described above, in the embodiment, positional information (two-dimensional positional information) of eight alignment marks in total can be detected at the point in time when detection of the alignment marks in the second alignment shot areas ends. Thus, at this stage, main controller 20 obtains the scaling (the shot magnification) of wafer W by, for example, performing a statistical computation based on the EGA method described above using the positional information, and based on the computed shot magnification main controller 20 may also adjust optical characteristics of projection optical system PL, for example, the projection magnification. In the embodiment, optical characteristics of projection optical system PL are adjusted by controlling an adjustment device 68 (refer to FIG. 5) that adjusts optical characteristics of projection optical system PL, by driving a specific movable lens constituting projection optical system PL or changing the pressure of gas inside the airtight room that is formed between specific lenses constituting projection optical system PL, or the like. That is, at the stage where alignment systems AL1 and AL2$_1$ to AL2$_4$ finish detecting a predetermined number (eight in this case) of marks on wafer W, main controller 20 may control adjustment device 68 so as to make adjustment device 68 adjust optical characteristics of projection optical system PL based on the detection results. Incidentally, the number of marks is not limited to eight, or to a half of the total number of marks subject to detection, but may be, for example, the number that is more than or equal to the number required for computation of the scaling of the wafer or the like.

Next, after the simultaneous detection of the alignment marks arranged in the five second alignment shot areas ends, main controller 20 starts again movement to the +Y direction of both stages WST and MST in the contact state (or proximity state), and at the same time, starts the focus mapping (detection of positional information (surface position information) of the wafer W surface related to the Z-axis direction) using the multipoint AF system (90a, 90b)

When performing the focus mapping, main controller 20 controls the position of wafer stage WST within the XY plane based on X head 66 that faces X scale 39X$_2$ (X linear encoder 70D) and two Y heads 64y$_2$ and 64y$_1$ that face Y scales 39Y$_1$ and 39Y$_2$ respectively (Y linear encoders 70F$_1$ and 70E$_1$).

Then, in a state of activating both the multipoint AF system (90a, 90b) and the surface position sensor, main controller 20 loads positional information (surface position information) of the wafer stage WST surface (the surface of plate 28) related to the Z-axis direction measured by the surface position sensor and positional information (surface position information) of the wafer W surface related to the Z-axis direction at a plurality of detection points detected by the multipoint AF system (90a, 90b) at predetermined sampling intervals, while wafer stage WST proceeds to the +Y direction, and makes three pieces of information, which are two kinds of the loaded surface position information and the measurement values of Y linear encoders 70F$_1$ and 70E$_1$ at the time of each samplings correspond to one another and sequentially stores them in the memory (not shown).

Figure 18:
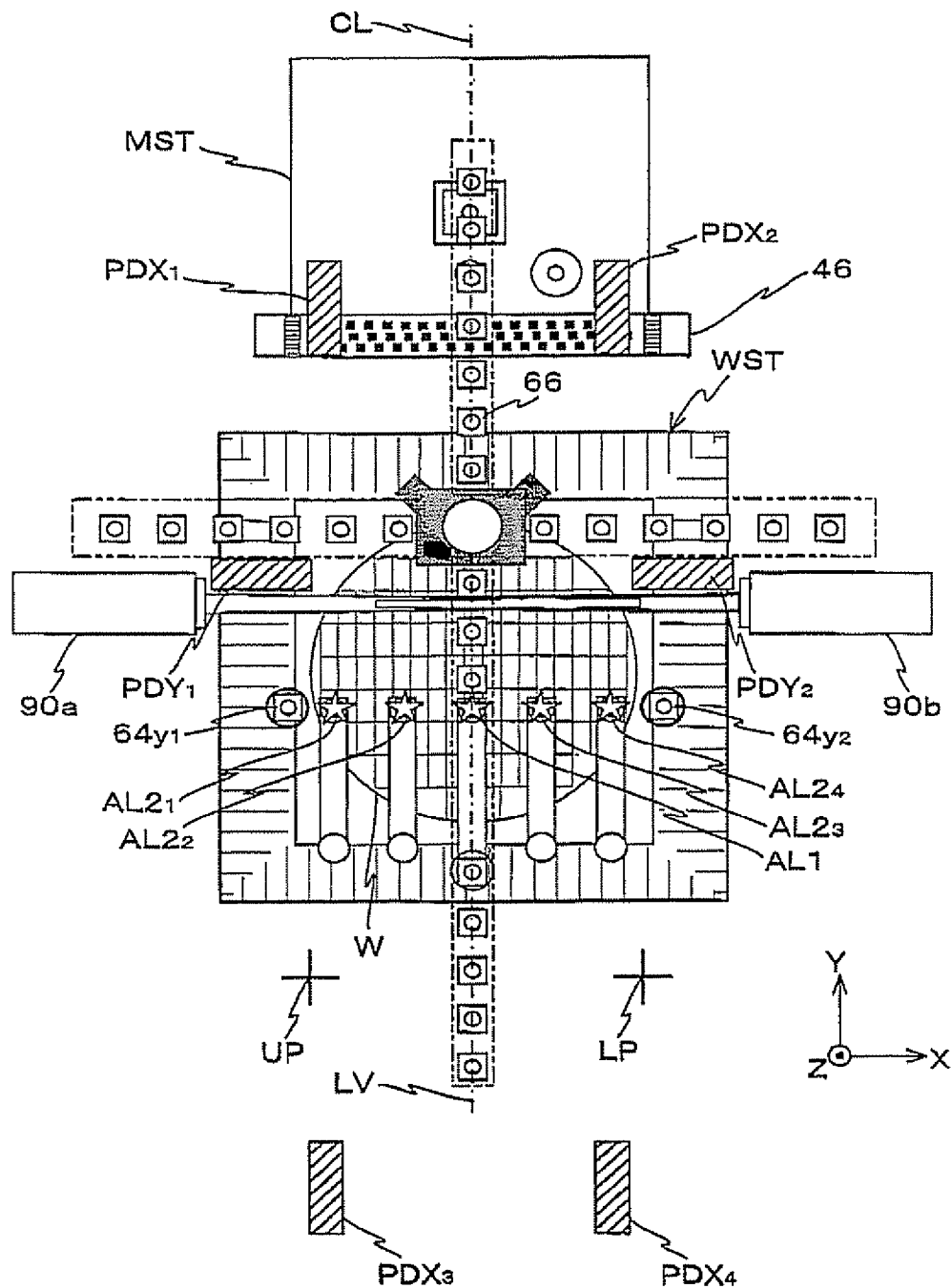
FIG. 18 is a view showing a state of the wafer stage and the measurement stage when alignment marks arranged in five third alignment shot areas are simultaneously being detected using alignment system AL1, and $AL2_2$, to $AL2_4$.
Figure 19:
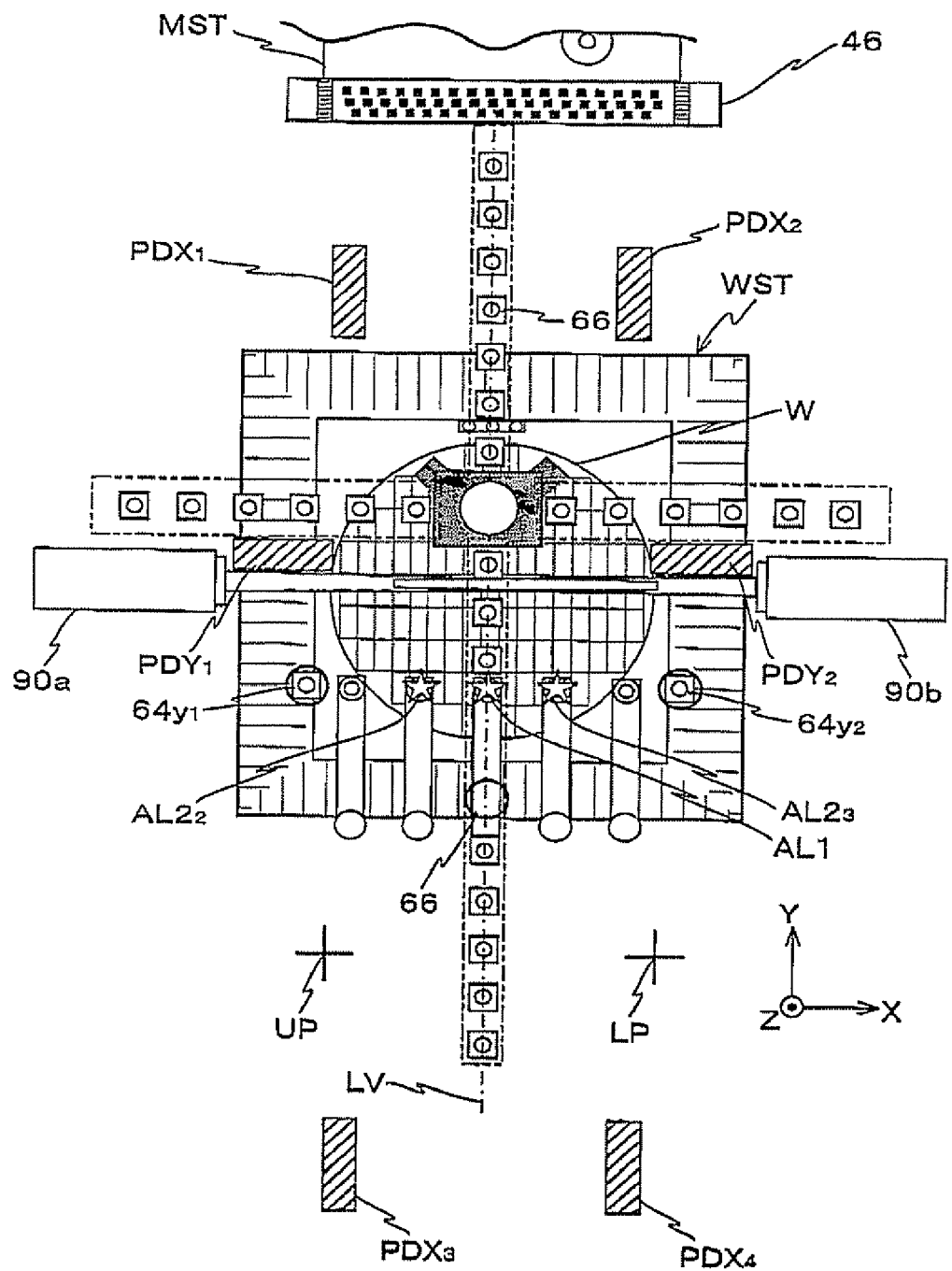
FIG. 19 is a view showing a state of the wafer stage and the measurement stage when alignment marks arranged in three fourth alignment shot areas are simultaneously being detected using alignment system AL1, $AL2_2$ and $AL2_3$.

When wafer stage WST reaches the position shown in FIG. 18 by movement to the +Y direction of both stages WST and MST in the contact state (or proximity state) described above, main controller 20 stops wafer stage WST at that position, and continues the movement of measurement stage MST to the +Y direction without stopping it. Incidentally, when measurement stage MST reaches an exposure start waiting position where measurement stage MST waits until exposure is started on the side of wafer stage WST, main controller 20 stops measurement stage MST at that position. Then, main controller 20 almost simultaneously and individually detects the alignment marks (refer to star-shaped marks in FIG. 18) arranged in five shot areas (hereinafter, referred to as "third alignment shot areas") that exist at positions that face alignment systems AL1 and AL2$_1$ to AL2$_4$ in FIG. 18, using five alignment systems AL1 and AL2$_1$ to AL2$_4$, links the detection results of five alignment systems AL1 and AL2$_1$ and AL2$_4$ and the measurement values of three encoders 70D, 70F$_1$ and 70E$_1$ at the time of the detection and stores them in the memory (not shown). Incidentally, the simultaneous detection of the alignment marks arranged in the five third alignment shot areas in this case is also performed while changing the Z-position of wafer stage WST, as is described above.

Next, main controller 20 starts movement of wafer stage WST to the +Y direction. Then, when wafer stage WST reaches the position shown in FIG. 19, main controller 20 immediately stops wafer stage WST, and almost simultaneously and individually detects the alignment marks (refer to star-shaped marks in FIG. 19) arranged in three shot areas (hereinafter, referred to as "fourth alignment shot areas") that f ace primary alignment system AL1 and secondary alignment systems AL2$_2$ and AL2$_3$ respectively in the state of FIG. 19, links the detection results of three alignment systems AL1, AL2$_2$ and AL2$_3$ and the measurement values of the three encoders described above at the time of the detection, and stores them in the memory (not shown). Incidentally, the simultaneous detection of the alignment marks arranged in the three fourth alignment shot areas in this case is also performed while changing the Z-position of wafer stage WST, as is described above. At this point in time, the focus mapping is being continued. Meanwhile, measurement stage MST is still waiting at the exposure start waiting position described above. Then, main controller 20 performs a statistical computation, for example, based on the EGA method described above using the detection results of the 16 alignment marks in total obtained as described above and the corresponding measurement values of the four encoders, and computes alignment information (coordinate values) of all the shot areas on wafer W in an XY coordinate system that is defined by measurement axes of the four encoders.

Next, main controller 20 continues the focus mapping while moving wafer stage WST to the +Y direction again.

Figure 20:
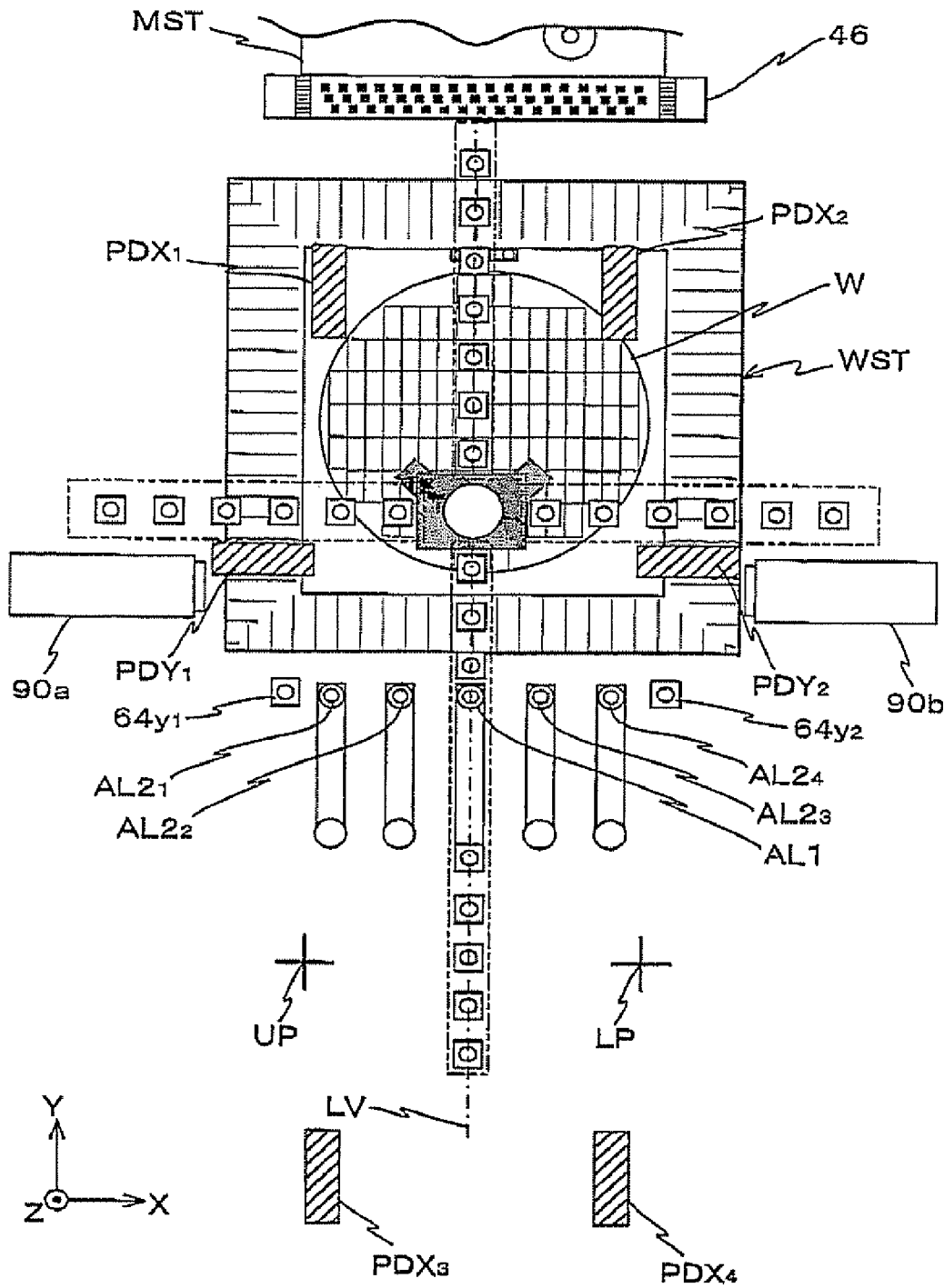
FIG. 20 is a view showing a state of the wafer stage and the measurement stage when focus mapping ends.
Figure 21:
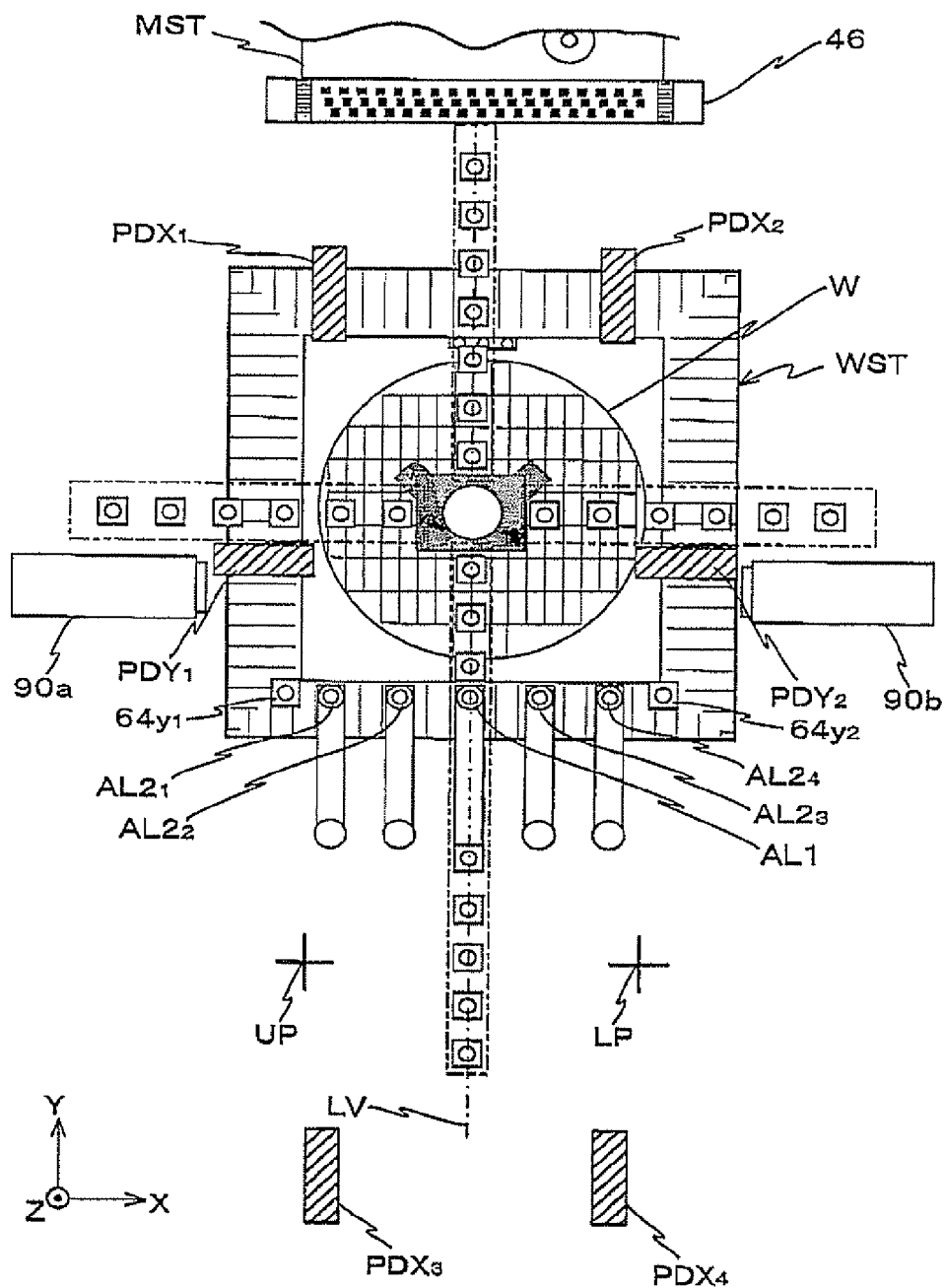
FIG. 21 is a view showing a state of the wafer stage and the measurement stage during an exposure operation.

Then, when the detection beam from the multipoint AF system ($90a$, $90b$) begins to be away from the wafer W surface, as is shown in FIG. 20, main controller 20 ends the focus mapping. At this point in time, main controller 20 converts the surface position information regarding each detection point of the multipoint AF system ($90a$, $90b$) into data with reference to the surface position information by the surface position sensor that has been simultaneously loaded. After that, based on the result of the foregoing wafer alignment (EGA), the latest baselines of five alignment systems AL1 and $AL2_1$ to $AL2_4$, and the like, main controller 20 performs exposure based on a step-and-scan method in a liquid immersion exposure method and sequentially transfers a reticle pattern on a plurality of shot areas on wafer W. This state is shown in FIG. 21. Afterwards, the similar operations are repeatedly performed to the remaining wafers within the lot.

In this case, during the exposure operation, as can be seen from the drawings such as FIG. 21 or FIG. 9, in order to perform exposure to the substantially entire surface of wafer W, the detection beam from irradiation system 69A of detection device $PDY_1$ is irradiated at least once to the entire area in the Y-axis direction of scale $39Y_2$. Accordingly, in the case where the scattered light is received by image sensor 67 that constitutes detection device $PDY_1$, main controller 20 judges that a foreign substance exists on scale $39Y_2$, and from the measurement result of encoder 70C at the time of the detection, detects the Y-axis direction position (coordinate) of the foreign substance. Further, based on the detection result by image sensor 67 and the measurement result of encoder 70B or 70D, main controller 20 detects the position (coordinate) of the foreign substance on scale $39Y_2$.

Further, the detection beam of detection device $PDY_2$ is also irradiated at least once to the entire area in the Y-axis direction of scale $39Y_1$ during the exposure operation similarly to the case of detection device $PDY_1$, and therefore, in the case where the scattered light is received by image sensor 67 that constitutes detection device $PDY_2$, main controller 20 judges that a foreign substance exists on scale $39Y_1$, and from the measurement result of encoder 70A at the time of the detection, detects the position (coordinate) of the foreign substance. Further, based on the detection result of detection device $PDY_2$ and the measurement result of encoder 70B or 70D, main controller 20 executes judgment as to whether a foreign substance exists or not, and detection of the position (coordinate) of the foreign substance on scale $39Y_1$.

Further, during the exposure operation described above, as is representatively shown in FIG. 21, detection device $PDX_1$ or $PDX_2$ faces scale $39X_1$, and during the exposure operation, the detection beam of detection device $PDX_1$ or $PDX_2$ is irradiated at least once to the entire surface area of scale $39X_1$. Accordingly, main controller 20 executes judgment as to whether a foreign substance exists or not, and detection of the position (coordinate) of the foreign substance on scale $39X_9$ in the manner similar to the manner described above, using encoders 70B and 70A or 70C and detection devices $PDX_1$ and $PDX_2$.

Moreover, as is shown in FIGS. 12 to 14, while wafer stage WST is moving front unloading position UP to loading position LP, detection device $PDX_3$ or $PDX_4$ faces scale $39X_2$, and either of the detection beam of detection device $PDX_3$ or the detection beam of detection device $PDX_4$ is irradiated at least once to the entire surface area of scale $39X_2$, and therefore main controller 20 executes judgment as to whether a foreign substance exists or not, and detection of the position (coordinate) of the foreign substance on scale $39X_2$ using detection device $PDX_3$ or $PDX_4$ and encoders 70D and Y-axis interferometer 16.

Further, as is shown in FIGS. 9 and 18, in the case where liquid immersion area 14 does not exists on measurement stage MST and measurement stage MST can freely move, main controller 20 moves measurement stage MST to a position where reference grating 52 on CD bar 46 faces detection device $PDX_1$ or $PDX_2$, and executes judgment as to whether a foreign substance exists on reference grating 52 or not, and detection of the position (coordinate) of the foreign substance on reference grating 52 using detection device $PDX_1$ or $PDX_2$.

Incidentally, not limited to the cases described above, but for example, as is shown in FIGS. 15 to 19, also while the alignment operation using alignment systems AL1 and $AL2_1$ to $AL2_4$ and the movement operation accompanying the alignment operation are being performed, the detection beam of detection device $PDY_1$ ($PDY_2$) is irradiated to the entire area of scale $39Y_2$ ($39Y_1$) r and therefore, detection (inspection) of foreign substance on the upper sauce of scale $39Y_2$ ($39Y_1$) may also be performed using detection device $PDY_1$ ($PDY_2$) during these operations. That is, the foreign substance detection operation may be carried out at least partially in parallel with another operation that is different from the exposure operation. Incidentally, the foreign substance detection operation may be carried out at least partially by itself. In this case, the placement and/or the number of the detection devices for foreign substance may be different from that/those in FIG. 3.

In the embodiment, in the case where the judgment is made that a foreign substance exists on the scale surface as a result of the above-described detection (inspection) of foreign substance, based on the foreign substance detection result, main controller 20 judges whether to perform cleaning (or replacement) of the scale or to continue the exposure operation (including the alignment operation and the like) in accordance with, for example, the operation status or the like, and in the case where the exposure operation (including the alignment operation and the like) is continued, the heads are selected avoiding the foreign substance so that the head that faces the foreign substance is not used during the operation. The heads that do not face the foreign substance are used by, for example, selecting the heads of three head units that do not face the foreign substance out of the four head units, or by changing the switching timing of heads in each head unit. That is, based on the foreign substance detection result, an area where the foreign substance exists on the scale is identified as a non-measurement area to which measurement by encoder system 200 cannot be performed or with which measurement value becomes abnormal. Furthermore, in an operation in which position measurement of wafer stage WST by encoder system 200 is performed, for example, in the exposure operation, while selecting three encoder heads that do not face the non-measurement area according to the position of wafer stage WST, the position of wafer stage WST is controlled using the selected three encoder heads. Then, for example, at this stage, wafer stage WST is moved via stage drive system 124, so that a portion where the foreign substance of the scale exits is located immediately below projection unit PU when exposure to wafer W mounted on wafer stage WST ends. That is, a portion of the scale that includes the foreign substance moves into liquid immersion area 14. Since local liquid immersion device 8 performs supply and recovery of liquid Lq in parallel, the foreign substance that has moved into liquid immersion area 14 is recovered together with liquid Lq. With this operation, the foreign substance on the scale is removed (cleaned).

Then, when the foreign substance removal described above is finished, main controller 20 returns wafer stage WST to the previous position and executes the continuation of the operation that has been performed partway. In this case, because exposure of wafer W and removal of foreign substance are completed, wafer stage WST is moved to unloading position UP to perform wafer exchange, and the exposure sequence is continued. Incidentally, the foreign substance removal is to be performed immediately after exposure of wafer W ends, but for example, when the exposure sequence ends, the foreign substance removal sequence may be carried out, that is, the foreign substance removal operation can be started. Further, the non-measurement area of the scale identified from the foreign substance detection result may be only an area where the foreign substance exists but may also be an area larger than the foreign substance.

Meanwhile, in the case where the judgment is made that the cleaning (or replacement) of the scale should be performed based on the foreign substance detection result, main controller 20 immediately discontinues the exposure operation and performs the necessary process. Incidentally, the necessary process may be started when exposure of wafer W ends, without immediately stopping the exposure operation. Further, in the case where the foreign substance detection operation is performed prior to the exposure operation, whether or not the exposure operation can be carried out may be judged based on the foreign substance detection result. As an example, in the case where no foreign substance exists on the scale, or measurement by the encoder system can be performed even when a foreign substance exists, or three heads can be selected avoiding the foreign substance (the non-measurement area), the judgment is made that the exposure operation can be carried out. On the other hand, in the case where the control accuracy of wafer stage WST (or the alignment accuracy of the wafer with respect to the reticle pattern) exceeds a permissible value due to measurement defect of the encoder system owing to the foreign substance, the judgment is made that the exposure operation cannot be carried out and the necessary process (the cleaning or replacement of the scale) is carried out.

As is described above, according to the embodiment, the surface state of the scales (the existence state of foreign substance) is detected by irradiating the detection beam from irradiation system 69A of detection devices $PDX_1$ to $PDX_4$, $PDY_1$ and $PDY_2$ to scales $39X_1, 39X_2, 39Y_1$ and $39Y_2$ that are used to measure the position of wafer stage WST, and detecting the detection beam via scales $39X_1, 39X_2, 39Y_1$ and $39Y_2$ (scattered on scales $39X_1, 39X_2, 39Y_1$ and $39Y_2$) by photo-detection system 69B, and therefore detection of the surface state can be performed contactlessly with respect to the scales.

Further, according to the embodiment, the detection device can detect the surface state of the scales (the existence state of foreign substance), and therefore by performing position measurement of wafer stage WST using the scales taking the surface state into consideration, the highly precise position control of wafer stage WST can be performed. In particular, in the embodiment, in the case where a foreign substance is found as a result of the detection of the detection device, the exposure operation is to be performed after the foreign substance is removed, and thus the highly precise position control of wafer stage WST can be performed without being affected by the foreign substance.

Further, since the highly precise position control of wafer stage WST can be performed as is described above, exposure to wafer W held on wafer stage WST can be performed with high accuracy.

Further, according to the embodiment, the detection device also detects the surface state (the existence state of foreign substance) of reference gratings 52 on CD bar 46, and therefore, the relative positional relation of (the detection center of) secondary alignment system $AL2_n$ with reference to (the detection center of) primary alignment system AL1 can be detected with high accuracy, by performing the Sec-BCHK (interval) taking the surface state into consideration (such as removing the foreign substance). Besides, by performing exposure using this result, exposure with high precision can be achieved.

Further, according to the embodiment, because the encoder system that includes encoders 70A to 70D and the like having good short term stability of measurement measures positional information of wafer stage WST within the XY plane, the measurement can be performed with high precision without being affected by air fluctuations or the like.

Incidentally, in the embodiment described above, the detection (the inspection) of foreign substance on the scale surface is to be performed in parallel with operations of exposure apparatus 100 such as the exposure operation, the alignment operation, or the wafer exchange operation being performed, but the present invention is not limited thereto. For example, when exposure apparatus 100 is in the idle state (i.e. in the waiting state in which none of operations such as the exposure operation, the alignment operation, and the wafer exchange operation is performed), the foreign substance inspection of the scale surface may also be performed by moving wafer stage WST so that the detection beam of the detection device is irradiated to the entire area of the scale surface.

Further, the timing of the foreign substance inspection is not limited to each time when exposing one wafer as in the embodiment described above, but the foreign substance inspection may also be performed at each predetermined interval, such as each time when exposing a predetermined number of wafers or each time when a predetermined period of time lapses, or the foreign substance inspection may also be performed only when the instruction by a worker is made (when the entry to an input device (e.g. an inspection start button) of exposure apparatus 100 is made). Further, the sequence may also be employed in which the detection (the inspection) of foreign substance is performed at each predetermined interval and the detection (the inspection) of foreign substance is also performed when the instruction by a worker is made. Alternatively, the sequence may also be employed in which the foreign substance inspection of part of the scales is performed when exposure to one wafer is performed and the foreign substance inspection of the reaming part of the scales is performed when exposure to the subsequent wafers is performed.

Incidentally, in the embodiment described above, in the case where a foreign substance exists on the scale surface, the foreign substance is to be removed (cleaned) using the liquid (the liquid used for liquid immersion exposure) of local liquid immersion device 8, but the present invention is not limited thereto, and for example, the foreign substance may also be removed (cleaned) by supplying another liquid (cleaning liquid), which is different from the liquid used for liquid immersion exposure, from local liquid immersion device 8 and using another liquid. As the cleaning liquid, for example, a liquid having a higher oxygen concentration than liquid Lq (e.g. a liquid to which degassing treatment is not applied) may also be used. By performing cleaning using such a liquid, it becomes possible to enhance oxidative degradation of the foreign substance (e.g. the foreign substance made up of organic substance). Incidentally, instead of such a liquid, the cleaning may also be performed using, for example, a hydrogen peroxide solution. Further, when performing the cleaning of the scale by the liquid for liquid immersion exposure or for cleaning, for example, optical cleaning by exposure light IL and/or ultrasonic cleaning may also be used in combination.

Further, a device similar to local liquid immersion device 8 is arranged at exposure apparatus 100 and by using such a device, the foreign substance on the scale may be removed. That is, a cleaning device (a foreign substance removal device) that is at least partially different from local liquid immersion device 8 may be arranged at another position that is separate from projection optical system PL (nozzle unit 32), for example, in a movement route of wafer stage WST between the exposure position where exposure light IL is irradiated via projection optical system PL and the water exchange position.

Further, the present invention is not limited to the case where the foreign substance is removed using liquid, but an air-blow device that blows out air is arranged in exposure apparatus 100 and by using the air blown out from the air-blow device, the foreign substance on the scale surface may be removed. Further, a heating device that removes the foreign substance by heating it is arranged in exposure apparatus 100, and by using the heating device, the foreign substance on the scale may be removed.

Further, in the case where a foreign substance exists on the scale surface, main controller 20 may only issue a warning to a worker (an operator). In this case, the worker (the operator) may stop the exposure apparatus to perform the maintenance operation. Further, in the embodiment described above, only in the case where more than a predetermined number of foreign substances exist, the foreign substance removal operation may be performed (or the warning may be issued). Or, only in the case where the exposure operation cannot be carried out as is described above, the foreign substance removal operation may be performed or the warning may be issued.

Incidentally, in exposure apparatus 100 of the embodiment described above, six detection devices ($PDX_1$ to $PDX_4$, $PDY_1$ and $PDY_2$) are to be arranged as is shown in FIG. 3, but the present invention is not limited thereto, and the number of the detection devices may be any number as far as the detection beam can be irradiated to the entire areas of the scales. Further, the placement of the detection devices is not limited to the placement of the embodiment described above as far as the detection beam can be irradiated to the entire area of the scales. Incidentally, an area to which foreign substance detection is performed may be the entire surface of the scale or may be only an area that is needed for position measurement of wafer stage WST.

Incidentally, the case has been described so far where the foreign substance on the scale is dust or a water drop, but the foreign substance subject to detection of the detection devices is not limited to dust or a water drop.

Further, in the embodiment described above, the case has been described where detection of foreign substance on the scale and various processes accompanying the detection are performed in relation to the position measurement by the encoders of encoder system 200, but this can be similarly applied to the Z sensors described above that detects the scale as the detection surface. That is, a process of selecting the Z sensor avoiding the foreign substance (the non-measurement area), and a process of performing cleaning or replacement of the scale if measurement defect of the Z sensors occurs due the foreign substance, and the like can be performed.

Further, in the embodiment described above, as is shown in FIG. 7A, the encoder based on a diffraction interference method, in which the light from the light source is branched by an optical element such as the beam splitter and which is equipped with two reflection mirrors that reflect the lights after being branched is to be used as encoders 70A to 70F, but the present invention is not limited thereto. An encoder based on a diffraction interference method having three gratings, a pickup method, or a magnetic method, or an encoder equipped with an light reflection block, as is disclosed in, for example, Kokai (Japanese Unexamined Patent Application Publication) No. 2005-114406 and the like, a so-called scan encoder that is disclosed in, for example, U.S. Pat. No. 6,639,686 and the like may also be used. Further, in the embodiment described above, head units 62A to 62D are to have a plurality of heads placed at a predetermined distance, but the present invention is not limited thereto, and a single head may also be employed that is equipped with a light source that emits a light beam to an area elongated in the pitch direction of the Y scale or the X scale, and many photodetection elements densely disposed in the pitch direction of the Y scale or the X scale that receive a reflected light (a diffracted light) of the light beam from (the diffraction grating of) the Y scale or the X scale.

Further, in the embodiment described above, the X heads and the Y heads, that is, one-dimensional heads are used as the encoder heads, but the present invention is not limited thereto, and a two-dimensional head (a 2D head) whose measurement directions are two orthogonal axes directions may also be used. Further, as the encoder head, a head integral with the Z sensor may be used. In the case of the integral head, a simple combination of the Z sensor and the encoder head may be employed, but a single sensor equipped with functions of the Z sensor and the encoder head may also be used as the encoder head.

Further, in the embodiment described above, the case has been described where second water repellent plate 28b is formed by two plate-shaped members 29a and 29b stuck together, but the present invention is not limited thereto, and second water repellent plate 28b is composed of one plate-shaped member and the diffraction grating may be directly formed on its upper surface. Further, the diffraction grating is formed on the upper surface of second water repellent plate 28b, and a protective member (e.g. a thin film) that can transmit the detection light from head units 62A to 62D is arranged on the upper surface of water repellent plate 28b, so that damage of the diffraction grating may be prevented. Further, the diffraction grating is directly formed on the wafer stage WST surface, and second water repellent plate 28b may be arranged so as to cover the diffraction grating. Further, as the diffraction grating, a diffraction grating having narrow slits or grooves that are mechanically graved may also be employed, or for example, a diffraction grating that is created by exposing interference fringes on a photosensitive resin may also be employed.

Further, in the embodiment described above, a reflective diffraction grating is to be arranged on the upper surface of wafer stage WST that is substantially parallel to the XY plane, but for example, the reflective diffraction grating may be arranged on the lower surface of wafer stage WST. In this case, head units 62A to 62D are placed on, for example, a base plate which the lower surface of wafer stage WST faces. Moreover, as is disclosed in U.S. Patent Applications Publications Nos. 2006/0227309, 2007/0052976, 2007/0263197 and the like, an encoder system, in which encoder heads are arranged on wafer stage WST and scales are arranged above wafer stage WST so as to face the encoder heads, may also be employed. In this case, Z sensors may also be placed on wafer stage WST and a predetermined surface (e.g. the surface) of the scale may be used also as a reflection surface that reflects measurement beams from the Z sensors. Further, for example, the detection devices described above are arranged at a movable body that is placed on base board 12, and while moving the movable body, the foreign substance detection may be performed to the entire surface of the scale. Furthermore, the foreign substance removal device described above is also arranged at the movable body, and the foreign substance of the scale may be removed based on the foreign substance detection result. Incidentally, the movable body may be measurement stage MST, or may be provided separately from wafer stage WST and measurement stage MST. Further, the detection devices and the foreign substance removal device described above may be mounted on different movable bodies. Further, in the embodiment described above, wafer stage WST is to be moved within a horizontal plane, but wafer stage WST may also be moved within a plane (e.g. a ZX plane) that intersects the horizontal plane. Further, the position of reticle stage RST may be measured by the encoder system. For example, in the case where reticle stage RST moves two-dimensionally, an encoder system having a configuration similar to the encoder system described above may also be arranged to measure positional information of reticle stage RST. In this case, for example, the detection devices described above may also be used in order to detect a foreign substance on the scale (the diffraction grating) arranged on reticle stage RST. In either case, it is possible to detect a foreign substance on the scale by arranging the detection devices of the embodiment described above at the position facing the diffraction grating (the scale).

Further, a configuration of the detection device that detects a foreign substance is not limited to the configuration in the embodiment described above (FIG. 4A), but other configurations may also be employed as far as a detection device detects a foreign substance by irradiating the detection bean to the scale and receiving the detection beam via the scale. For example, the multipoint AF system described above may also be used as the detection device, and in this case, the detection devices described above do not have to be provided separately from the multipoint AF system. Further, for example, in the cases such as when by using the Z sensors described above or the like, the Z-position of the surface (including the scale surface) of areas other than the area where wafer W is mounted on the upper surface of wafer stage WST is detected, that is, the Z-position of the measurement surface of the Z sensor is detected, the detection device may detect a foreign substance not only on the scale but also on the surface (the measurement surface) of the areas other than the area where wafer W is mounted on the upper surface of wafer stage WST. With this operation, a foreign substance on the measurement surface can be detected by a detection device that is the same as or different from each of the detection devices of the embodiment described above, similarly to the case where a foreign substance on the scale is detected by each of the detection devices in the embodiment described above, which makes it possible to gain the effect equivalent to the embodiment described above.

Incidentally, in the embodiment described above, the lower surface of nozzle unit 32 and the lower end surface of the tip optical element of projection optical system PL are to be substantially flush. However, the present invention is not limited to thereto, and for example, the lower surface of nozzle unit 32 may also be placed closer to the image plane of projection optical system PL (i.e. to the wafer) than the outgoing surface of the tip optical element. That is, the constitution of local liquid immersion device 8 is not limited to the above-described constitution, and the constitutions can be used, which are described in, for example, European Patent Application Publication No. 1 420 298, the pamphlet of International Publication No. 2004/055803, the pamphlet of International Publication No. 2004/057590, the pamphlet of International Publication No. 2005/029559 (the corresponding U.S. Patent Application Publication No. 2006/0231206), the pamphlet of International Publication No. 2004/086468 (the corresponding U.S. Patent Application Publication No. 2005/0280791), Kokai (Japanese Unexamined Patent Application Publication) No. 2004-289126 (the corresponding U.S. Pat. No. 6,952,253), and the like. Further, as is disclosed in the pamphlet of International Publication No. 2004/019128 (the corresponding U.S. Patent Application Publication No, 2005/0248856), the optical path on the object plane side of the tip optical element may also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in the embodiment described above, pure water (water) is to be used as liquid, however, the present invention is not limited thereto as matter of course.

Further, in the embodiment described above, the recovered liquid may be reused, and in this case, a filter that removes impurities from the recovered liquid is preferably arranged in a liquid recovery device, a recovery pipe or the like.

Further, in the embodiment described above, the case has been described where the exposure apparatus is a liquid immersion type exposure apparatus, but the present invention is not limited thereto and can also be employed in a dry type exposure apparatus that performs exposure of wafer W without liquid (water).

Incidentally, in the embodiment described above, the case has been described where the present invention is applied to the exposure apparatus that is equipped with all of water stage WST (a movable body), measurement sage MST (another movable body), the alignment systems (AL1, AL2$_1$ to AL2$_4$), the multipoint AF system (90a, 90b), interferometer system 118, encoder system 200 and the like, but the present invention is not limited thereto. For example, the present invention can also be applied to an exposure apparatus in which measurement stage MST or the like is not arranged. Further, it is a matter of course that both of the interferometer system and the encoder system do not always have to be arranged. That is, only the encoder system may be arranged.

Incidentally, in the embodiment described above, the case has been described where the FIA system is employed as the alignment system, but the present invention is not limited thereto, and for example, an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used by itself or in combination as needed. Further, five alignment systems AL1 and AL2$_1$ to AL2$_4$ are to be arranged in the embodiment described above, but the number of alignment systems is not limited to five, and may be the number more than or equal to two and less than or equal to four, or may be the number more than or equal to six, or may be the even number, not the odd number. Moreover, one alignment system may be arranged, and alignment system (s) may be either movable or fixed.

Further, in the embodiment described above, the case has been described where the present invention is applied to a scanning exposure apparatus based on a step-and-scan method or the like, but the present invention is not limited thereto, and may also be applied to a static exposure apparatus such as a stepper. Even with the stepper or the like, by measuring the position of a stage on which an object subject to exposure is mounted using encoders, occurrence of position measurement error caused by air fluctuations can substantially be nulled likewise. In this case, it becomes possible to set the position of the stage with high precision based on correction information used to correct the short-term fluctuation of the measurement value of the encoders using the measurement values of the interferometers and the measurement Values of the encoders, and as a consequence, highly accurate transfer of a reticle pattern onto the object can be performed. Further, the present invention can also be applied to a reduced projection exposure apparatus based on a step-and-stitch method that synthesizes a shot area and a shot area, an exposure apparatus based on a proximity method, a mirror projection aligner, or the like. Moreover, the present invention can also be applied to a multi-stage type exposure apparatus equipped with a plurality of wafer stages, as is disclosed in, for example, Kokai (Japanese Unexamined Patent Application Publications) No. 10-163099 and No. 10-214783 (the corresponding U.S. Pat. No. 6,590,634), Kohyo (published Japanese translation of International Publication for Patent Application) No. 2000-505958 (the corresponding U.S. Pat. No. 5,969,441), the U.S. Pat. No. 6,206,407, and the like.

Further, the magnification of the projection optical system in the exposure apparatus in the embodiment described above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Moreover, exposure area IA to which illumination light IL is irradiated via projection optical system PL is an on-axis area that includes optical axis AX within the field of projection optical system PL. However, for example, as is disclosed in the pamphlet of International Publication No. 2004/107011, the exposure area may also be an off-axis area that does not include optical axis AX, similar to a so-called inline type catadioptric system, in part of which an optical system (a catoptric system or a catadioptric system) that has a plurality of reflection surfaces and forms an intermediate image at least once is arranged, and which has a single optical axis. Further, the illumination area and exposure area described above are to have a rectangular shape, but the shape is not limited to rectangular, and may also be circular arc, trapezoidal, parallelogram or the like.

Incidentally, the light source of the exposure apparatus in the embodiment described above is not limited to the ArF excimer laser, but a pulsed laser light source such as a KrF excimer laser (output wavelength: 248 nm), an $F_2$ laser (output wavelength: 157 nm) an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generation device of a YAG laser or the like can also be used. Besides, as is disclosed in, for example, the pamphlet of International Publication No. 1999/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, may also be used.

Further, in the embodiment described above, illumination light IL of the exposure apparatus is not limited to the light having a wavelength more than or equal to 100 nm, and it is needless to say that the light having a wavelength less than 100 nm may be used. For example, in recent years, in order to expose a pattern less than or equal to 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides, the present invention can also be applied to an exposure apparatus that uses charged particle beams such as an electron beam or an ion beam.

Further, in the embodiment described above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (a spatial light modulator) or the like) on which a light-transmitting pattern, a reflection pattern, or an emission pattern is formed according to electronic data of the pattern that is to be exposed may also be used.

Further, as is disclosed in, for example, the pamphlet of International Publication No. 2001/035168, the present invention can also be applied to an exposure apparatus (a lithography system) that forms line-and-space patterns on a water by forming interference fringes on the wafer.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, Kohyo (published Japanese translation of International Publication for Patent Application) No. 2004-519850 (the corresponding U.S. Pat. No. 6,611,316).

Further, an apparatus that forms a pattern on an object is not limited to the exposure apparatus (the lithography system) described above, and for example, the present invention can also be applied to an apparatus that forms a pattern on an object based on an ink-jet method.

Incidentally, an object or which a pattern should be formed (an object subject to exposure to which an energy beam is irradiated) in the above-described embodiment is not limited to a wafer, but may be other objects such as a glass plate, a ceramic substrate, a film member, or a mask blank.

The usage of the exposure apparatus is not limited to the exposure apparatus used for manufacturing semiconductor devices, but the present invention can be widely applied also to, for example, an exposure apparatus for manufacturing liquid crystal display devices which transfers a liquid crystal display device pattern onto a square-shaped glass plate, and to an exposure apparatus for manufacturing organic ELs, thin-film magnetic heads, imaging devices (such as CCDs), micromachines, DNA chips or the like. Further, the present invention can also be applied to an exposure apparatus that transfers a circuit pattern onto a glass substrate or a silicon wafer not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Further, the exposure apparatus (the pattern formation apparatus) in the embodiment described above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the above disclosures of the various publications, the pamphlets of the International Publications, and the U.S. Patent Application Publications, and the U.S. Patents that are cited in the embodiment described above and related to exposure apparatuses and the like are each incorporated herein by reference.

Electron devices such as semiconductor devices are manufactured through the following steps: a step where the function/performance design of a device is performed; a step where a reticle based on the design step is manufactured; a step where a wafer is manufactured using materials such as silicon; a lithography step where a pattern of the mask (the reticle) is transferred onto the wafer by the exposure apparatus (the pattern formation apparatus) of the embodiment described above; a development step where the exposed wafer is developed; an etching step where an exposed member of an area other than the area where resist remains is removed by etching; a resist removing step where the resist that is no longer necessary when the etching is completed is removed; a device assembly step (including a dicing process, a bonding process, and a packaging process); an inspection step; and the like. In this case, in the lithography step, the exposure method described above is executed using the exposure apparatus (the pattern formation apparatus) of the embodiment described above and device patterns are formed on the wafer, and therefore, highly-integrated devices can be manufactured with high productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that exposes an object held by a movable body with an energy beam, the apparatus comprising:
    an encoder system of which one of a measurement member and a head member is arranged on the movable body and the other of the members is arranged facing the movable body, and which measures positional information of the movable body using a plurality of heads of the head member that faces the measurement member;
    a detection device that detects information on a surface state of the measurement member; and
    a controller that controls a position of the movable body based on the measured positional information and also selects a plurality of heads to be used for the measurement based on a result of the detection.

2. The exposure apparatus according to claim 1, wherein the controller switches at least one of the plurality of heads used for the measurement to another head during movement of the movable body.

3. The exposure apparatus according to claim 1, wherein a detection operation with respect to the measurement member by the detection device is at least partially carried out in parallel with another operation.

4. The exposure apparatus according to claim 3, wherein the another operation includes at least one of an exposure operation, an alignment operation and a movement operation of the object.

5. The exposure apparatus according to claim 1, wherein the result of the detection includes information on a foreign substance on the measurement member, and
    the exposure apparatus further comprises
    a foreign substance removal device that removes a foreign substance on the measurement member.

6. The exposure apparatus according to claim 1, further comprising:
    an optical member that emits the energy beam; and
    a liquid immersion system that forms a liquid immersion area between the optical member and the object.

7. The exposure apparatus according to claim 6, wherein the measurement member is arranged on the movable body and a surface of the measurement member comes into contact with the liquid immersion area by movement of the movable body.

8. The exposure apparatus according to claim 1, wherein the measurement member is arranged above the movable body and the detection device is arranged capable of moving relative to the measurement member.

9. The exposure apparatus according to claim 1, wherein the encoder system irradiates a measurement beam to a grating surface of the measurement member and measures positional information of the movable body within a predetermined plane.

10. The exposure apparatus according to claim 9, wherein the measurement member has the grating surface that is different from the surface.

11. An exposure method of exposing an object held by a movable body with an energy beam, the method comprising:
    a measurement process of measuring positional information of the movable body, using an encoder system of which one of a measurement member and a head member is arranged on the movable body and the other of the members is arranged facing the movable body, and which measures the positional information using a plurality of heads of the head member that faces the measurement member;

a detection process of detecting information on a surface state of the measurement member using a detection device; and a control process of controlling a position of the movable body based on the measured positional information and also selecting a plurality of heads to be used for the measurement based on a result of the detection.

12. The exposure method according to claim 11, wherein in the control process, at least one of the plurality of heads used for the measurement is switched to another head during movement of the movable body.

13. The exposure method according to claim 11, wherein a detection operation with respect to the measurement member by the detection device is at least partially carried out in parallel with another operation.

14. The exposure method according to claim 13, wherein the another operation includes at least one of an exposure operation, an alignment operation and a movement operation of the object.

15. The exposure method according to claim 11, wherein the result of the detection includes information on a foreign substance on the measurement member, and the exposure method further comprises a foreign substance removal process of removing a foreign substance on the measurement member in accordance with the result of the detection.

16. The exposure method according to claim 11, wherein exposure of the object is performed in a state where a liquid immersion area is formed between an optical member that emits the energy beam and the object.

17. The exposure method according to claim 16, wherein the measurement member is arranged on the movable body and a surface of the measurement member comes into contact with the liquid immersion area by movement of the movable body.

18. The exposure method according to claim 11, wherein the measurement member is arranged above the movable body and the detection device is arranged capable of moving relative to the measurement member.

19. The exposure method according to claim 11, wherein the encoder system irradiates a measurement beam to a grating surface of the measurement member and measures positional information of the movable body within a predetermined plane.

20. The exposure method according to claim 19, wherein the measurement member has the grating surface that is different from the surface.

* * * * *

UNITED STATES PATENT AND TRADEMARK OFFICE
CERTIFICATE OF CORRECTION

PATENT NO. : 8,098,362 B2
APPLICATION NO. : 12/128036
DATED : January 17, 2012
INVENTOR(S) : Yuho Kanaya It is certified that error appears in the above-identified patent and that said Letters Patent is hereby corrected as shown below:

On page 2, col. 2, line 12 the continuation of (56) References Cited, should read:

FOREIGN PATENT DOCUMENTS

WO          WO 2004/055803 A1 7/2004

Signed and Sealed this
Twenty-seventh Day of March, 2012

David J. Kappos
*Director of the United States Patent and Trademark Office*